US011339055B2

(12) United States Patent
Muramatsu et al.

(10) Patent No.: US 11,339,055 B2
(45) Date of Patent: May 24, 2022

(54) GRAPHITE/GRAPHENE COMPOSITE MATERIAL, HEAT COLLECTOR, A HEAT CONDUCTOR, A HEAT DISSIPATOR, A HEAT-DISSIPATION SYSTEM, AND A METHOD OF PRODUCING THE GRAPHITE/GRAPHENE COMPOSITE MATERIAL

(71) Applicant: INCUBATION ALLIANCE, INC., Hyogo (JP)

(72) Inventors: Kazuo Muramatsu, Hyogo (JP); Misato Hosokawa, Hyogo (JP)

(73) Assignee: INCUBATION ALLIANCE, INC.

( * ) Notice: Subject to any disclaimer, the term of this patent is extended or adjusted under 35 U.S.C. 154(b) by 388 days.

(21) Appl. No.: 16/341,896

(22) PCT Filed: Oct. 17, 2017

(86) PCT No.: PCT/JP2017/037603
§ 371 (c)(1),
(2) Date: Apr. 13, 2019

(87) PCT Pub. No.: WO2018/074493
PCT Pub. Date: Apr. 26, 2018

(65) Prior Publication Data
US 2019/0241435 A1  Aug. 8, 2019

(30) Foreign Application Priority Data

Oct. 19, 2016 (JP) .............................. JP2016-205089

(51) Int. Cl.
*C01B 32/194* (2017.01)
*C01B 32/21* (2017.01)
(Continued)

(52) U.S. Cl.
CPC .......... *C01B 32/194* (2017.08); *C01B 32/182* (2017.08); *C01B 32/20* (2017.08);
(Continued)

(58) Field of Classification Search
CPC ..... C01B 32/194; C01B 32/182; C01B 32/21; C01B 32/20; C01B 2204/04;
(Continued)

(56) References Cited

U.S. PATENT DOCUMENTS

2007/0110661 A1  5/2007 Hirose
2009/0035562 A1  2/2009 Fukushima
(Continued)

FOREIGN PATENT DOCUMENTS

CN        1926060 A    3/2007
CN      101151384 A    3/2008
(Continued)

OTHER PUBLICATIONS

Extended European Search Report dated Apr. 30, 2020, Application No. 17862007.6, PCT/JP2017037603, 9 pages total.
(Continued)

*Primary Examiner* — Tho V Duong
*Assistant Examiner* — Raheena R Malik
(74) *Attorney, Agent, or Firm* — Ware, Fressola, Maguire & Barber LLP

(57) ABSTRACT

The present invention provides a graphite/graphene composite material comprising flat graphite particles and graphene aggregates, wherein the flat graphite particles are stacked using the graphene aggregates as a binder so that the basal surfaces of the graphite particles are overlapped with one another, and the graphene aggregates are composed of deposited single-layer or multi-layer graphenes.

20 Claims, 9 Drawing Sheets

(51) Int. Cl.
*H01L 23/373* (2006.01)
*C01B 32/20* (2017.01)
*C01B 32/182* (2017.01)
*H05K 7/20* (2006.01)

(52) U.S. Cl.
CPC .......... *C01B 32/21* (2017.08); *H01L 23/373* (2013.01); *H05K 7/20* (2013.01); *C01B 2204/04* (2013.01); *C01B 2204/24* (2013.01); *C01B 2204/32* (2013.01); *C01P 2002/72* (2013.01); *C01P 2004/03* (2013.01); *C01P 2004/45* (2013.01); *C01P 2004/61* (2013.01); *C01P 2006/11* (2013.01); *C01P 2006/32* (2013.01)

(58) Field of Classification Search
CPC .......... C01B 2204/24; C01B 2204/32; C01P 2002/72; C01P 2004/03; C01P 2004/45; C01P 2004/61; C01P 2006/11; C01P 2006/32; H01L 23/373; H01L 23/36; H05K 7/20; B32B 9/00; B32B 9/007; B32B 15/04
USPC .......................................... 165/185
See application file for complete search history.

(56) References Cited

U.S. PATENT DOCUMENTS

| | | | | |
|---|---|---|---|---|
| 2012/0142832 | A1* | 6/2012 | Varma | C09D 5/24 524/145 |
| 2013/0213630 | A1 | 8/2013 | Southard, II | |
| 2014/0030590 | A1* | 1/2014 | Wang | H01M 4/587 429/211 |
| 2014/0116661 | A1 | 5/2014 | Xu et al. | |
| 2015/0329741 | A1* | 11/2015 | Yoo | C01B 32/192 428/219 |
| 2016/0115363 | A1 | 4/2016 | Lee et al. | |
| 2016/0153730 | A1* | 6/2016 | Park | B29B 9/12 165/133 |
| 2016/0185074 | A1 | 6/2016 | Kagawa | |
| 2017/0115074 | A1* | 4/2017 | Cheng | F28F 13/18 |
| 2017/0174519 | A1 | 6/2017 | Hirose | |
| 2017/0174521 | A1 | 6/2017 | Hasegawa et al. | |
| 2017/0174898 | A1 | 6/2017 | Hasegawa et al. | |
| 2017/0175023 | A1 | 6/2017 | Hasegawa et al. | |
| 2018/0327611 | A1* | 11/2018 | Scheffer | C09D 11/52 |

FOREIGN PATENT DOCUMENTS

| | | |
|---|---|---|
| CN | 102917574 A | 2/2013 |
| CN | 103533809 | 1/2014 |
| CN | 105016731 A | 11/2015 |
| CN | 105399081 A1 | 1/2016 |
| CN | 105408247 A | 3/2016 |
| CN | 105452159 A | 3/2016 |
| EP | 2 982 646 A1 | 2/2016 |
| EP | 3 034 292 A1 | 6/2016 |
| JP | H07109171 | 4/1995 |
| JP | 200662922 | 3/2006 |
| JP | 2007291267 | 11/2007 |
| JP | 2012096937 | 5/2012 |
| JP | 3186199 | 9/2013 |
| JP | 2014534645 | 12/2014 |
| JP | 2016522151 | 7/2016 |
| TW | 201511968 A | 4/2015 |
| WO | 2012/040148 A1 | 3/2012 |
| WO | 2021/040148 A1 | 3/2012 |

OTHER PUBLICATIONS

International Search Report dated ???, International Application No. PCT/JP2017/037603, 2 pages.
"Production of Exfoliated Graphite from Potassium-Graphite-Tetraydrofuran Ternary Compounds and its Applications" by M. Inagaki et al, Synthetic Metals, 8 (1983), pp. 335-342.
English Abstract, JP2006062922, 1 page.
English Abstract, JP3186199, 1 page.
English Abstract, JP2016522151, 1 page.
English Abstract, JP2014534645, 1 page.
English Abstract, JP2012096937, 1 page.
English Abstract, JP2007291267, 1 page.
English Abstract, CN103533809, 1 page.
English Abstract, JPH07109171, 1 page.
Taiwan office action dated Aug. 3, 2018, application No. 106135908 including search report at p. 10 with categories X, Y, and A indicated for four respective CN publications (D1-D2 & D4-D5), one JP publication (D3) already of record, and one TW publication (D6), 10 pages.
English translation of the Written Opinion of the ISA/JP (PCT/ISA/237) dated Jan. 9, 2018, International Application No. PCT/JP2017/037603, 16 pages.
International Search Report (PCT/ISA/210) dated Jan. 9, 2018 by ISA/JP, International Application No. PCT/JP2017/037603, 3 pages.
Written Opinion of the ISA/JP (PCT/ISA/237) dated Jan. 9, 2018, International Application No. PCT/JP2017/037603, 7 pages.
Chinese language office action, application 2017800643332, dated Mar. 2, 2022, 7 pages.
English language translation of Chinese language office action, application 2017800643332, dated Mar. 2, 2022, 5 pages.

* cited by examiner

FIG.2
(a)
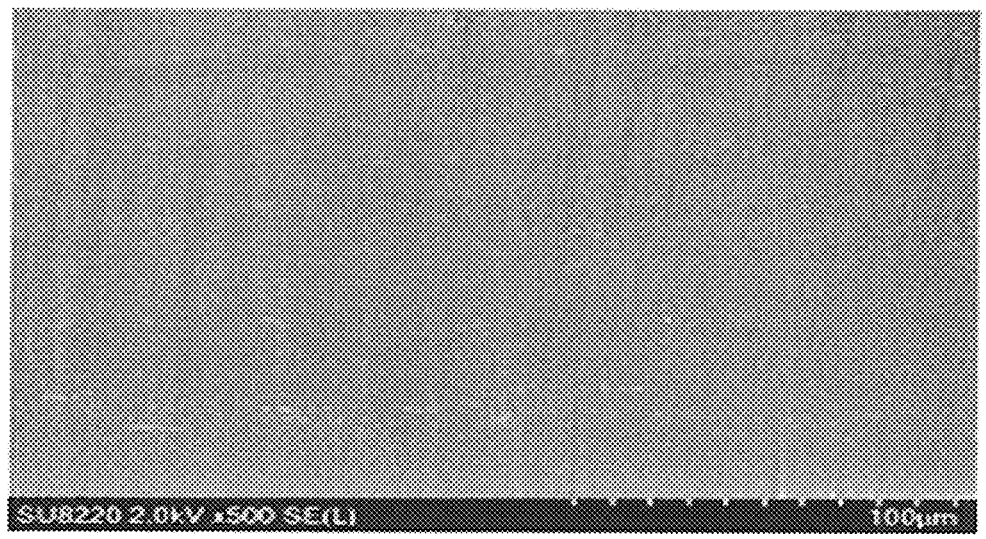
(b)
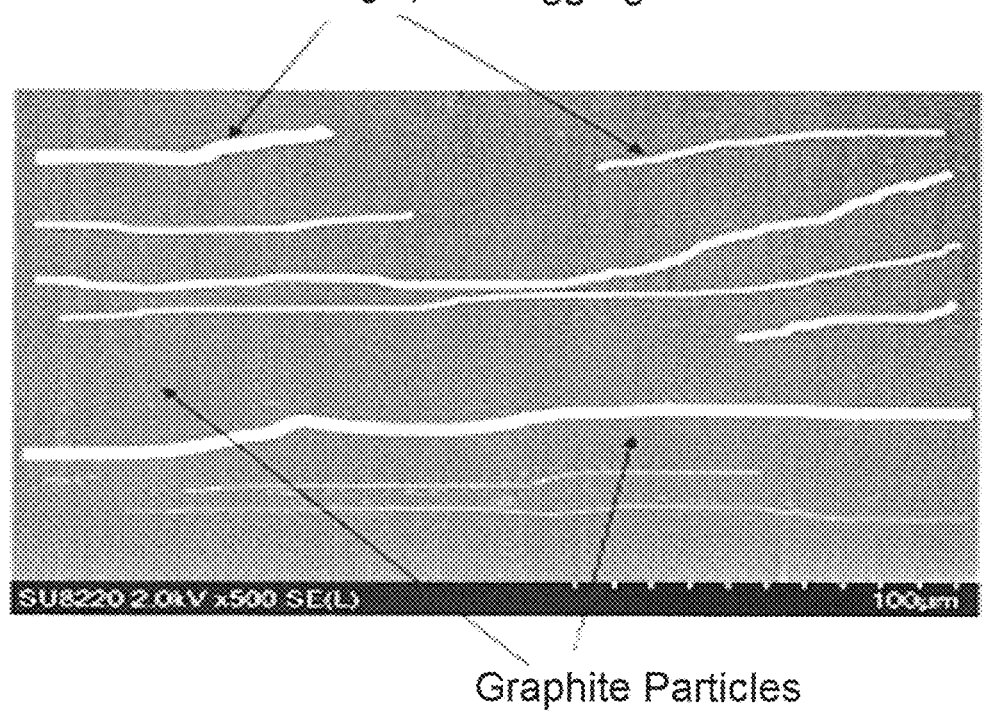

FIG. 8
(a)
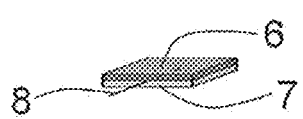
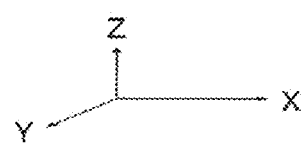
(b)
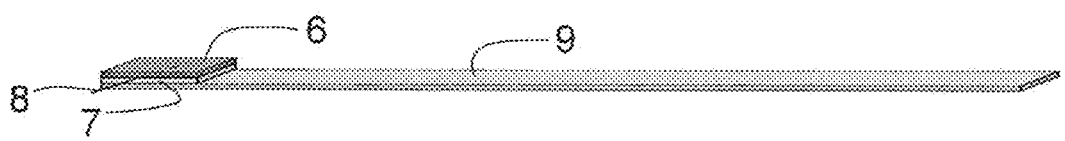
(c)
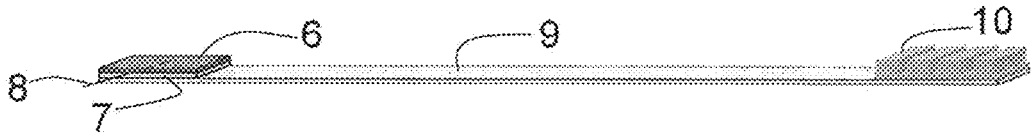

GRAPHITE/GRAPHENE COMPOSITE MATERIAL, HEAT COLLECTOR, A HEAT CONDUCTOR, A HEAT DISSIPATOR, A HEAT-DISSIPATION SYSTEM, AND A METHOD OF PRODUCING THE GRAPHITE/GRAPHENE COMPOSITE MATERIAL

TECHNICAL FIELD

The present invention relates to a graphite/graphene composite material, and a heat collector, a heat conductor and a heat dissipator comprising the composite material, and a heat dissipation system comprising at least one of the heat collector, the heat conductor and the heat dissipator comprising the graphite/graphene composite material.

BACKGROUND ART

Attention is directed to a problem with cooling of a semiconductor device and other heat-generating parts loaded on various electronic and electrical apparatuses such as a computer. For cooling such parts to be cooled, generally there are a method of mounting a fan on an apparatus housing in which the parts are mounted and cooling the apparatus housing, a method of mounting a thermal conductor such as a heat spreader or a heat sink on parts to be cooled and carrying heat from such a device to the outside for cooling the device. While an aluminum plate or a copper plate has been used so far as a thermally conductive material attached to the parts to be cooled, in recent years, attention is directed to graphite having excellent thermal diffusivity.

Graphite has a structure in which carbon atoms spread in a lamellar form, and has good thermal conductivity in its in-plane direction. In ideal graphite, its heat conductivity in the in-plane direction reaches to 2500 W/(m·K), which is much superior to a heat conductivity 398 W/(m·K) of copper. On the other hand, graphite is characterized in that a heat conductivity in a thickness direction of the graphite is only about 1/400 of a heat conductivity in its surface direction.

Examples of known graphite used as a thermally conductive material include graphite obtained by heat-treating a specific polymer such as polyimide (Patent Document 1), graphite obtained by subjecting a graphite intercalation compound to heat-treatment for expansion and, then, rolling or press-molding the expanded graphite (Non-patent Document 1), and the like.

PRIOR ART DOCUMENTS

Patent Document

Patent Document 1: JP H07-109171 A

Non-Patent Document

Non-patent Document 1: M. Inagaki, K. Muramatsu and Y. Maeda, Synthetic Metals, 8 (1983) pp. 335-342

SUMMARY OF INVENTION

Problem to be Solved by the Invention

However, in the case of heat-treating a polymer, while a material characterized in having a high heat conductivity of about 1600 W/(m·K) in an in-plane direction of graphite is obtained, there is a demerit such that it is difficult to obtain a material being thick in a stacking direction of graphite because cracking is easily to occur due to an influence of degassing from a starting material as a result of heat treatment. According to the method, an upper limit of a thickness of graphite is approximately 60 μm, and, therefore, a material being thicker than this is only obtained by laminating thin materials using an adhesive. However, in that case, there is a problem that thermal conductivity is deteriorated by the use of an adhesive.

Meanwhile, in the case of rolling and press-molding an expanded graphite, there is a merit such that it is possible to obtain a material having a thickness of about 400 μm. However, a heat conductivity is at most 200 to 600 W/(m·K) in the in-plane direction of graphite. Namely, while a degree of freedom of a thickness is comparatively large, there is a demerit such that thermal conductivity is relatively low.

In order to make use of an excellent thermal conductivity in the in-plane direction of graphite at the maximum, a material being thick in a stacking direction of graphite crystal is demanded. However, no material having high heat conductivity in an in-plane direction and being thick could have been obtained.

Means to Solve the Problem

In order to solve the above-mentioned problem, the inventors of the present invention have made intensive studies, and as a result, have found that when flat graphite particles are stacked using graphene aggregates as a binder, a material which has good thermal conductivity and assuring that a thickness in a stacking direction can be adjusted freely can be obtained, and have completed the present invention.

Namely, the present invention relates to:

[1] a graphite/graphene composite material comprising flat graphite particles and graphene aggregates, wherein the flat graphite particles are stacked using the graphene aggregates as a binder so that basal surfaces of the graphite particles are overlapped with one another, and the graphene aggregates are composed of deposited single-layer or multi-layer graphenes,

[2] the graphite/graphene composite material of above [1], wherein an average particle size of the flat graphite particles is 10 to 1000 μm, preferably 50 to 800 μm, preferably 100 to 400 μm, preferably 200 to 400 μm, and a thickness thereof is 1 to 50 μm, preferably 1 to 20 μm,

[3] the graphite/graphene composite material of above [1] or [2], wherein an average diameter of the graphene aggregates is 1 to 1000 μm, preferably 1 to 850 μm, more preferably 1 to 710 μm, further preferably 1 to 500 μm, and a thickness thereof is less than 50 μm, preferably less than 20 μm,

[4] the graphite/graphene composite material of any of above [1] to [3], wherein a mass ratio of the flat graphite particles to a total mass of the flat graphite particles and the graphene aggregates is 1 to 99 mass %, preferably 20 to 95 mass %, preferably 40 to 90 mass %,

[5] the graphite/graphene composite material of any of above [1] to [4], wherein a half value width (2θ) of a 004 diffraction line in X-ray diffraction is less than 0.3°, preferably less than 0.25°,

[6] the graphite/graphene composite material of any of above [1] to [5], having a bulk density of 1.9 g/cm$^3$ or more, preferably 2.1 g/cm$^3$ or more,

[7] the graphite/graphene composite material of any of above [1] to [6], having a thickness of 100 μm or more, preferably 1 mm or more, more preferably 10 mm or more, in a direction of stacking of the flat graphite particles,

[8] the graphite/graphene composite material, having a coating layer on a whole or a part of an outer surface of the graphite/graphene composite material of any of above [1] to [7],
[9] a heat collector comprising the graphite/graphene composite material of any of above [1] to [8],
[10] the heat collector comprising the graphite/graphene composite material of above [7], and having a structure such that a plurality of the graphite/graphene composite materials in a shape of column is embedded in a flexible material,
[11] a heat conductor comprising the graphite/graphene composite material of any of above [1] to [8],
[12] a heat dissipator comprising the graphite/graphene composite material of any of above [1] to [8],
[13] the heat dissipator of above [12], wherein the graphite/graphene composite material is combined with a metal for compensation of relatively lower thermal conductivity of the flat graphite particles in a stacking direction of graphite than in other directions,
[14] heat dissipation system comprising a heat collector absorbing heat from a heating element, a heat conductor transmitting heat from the heat collector to a heat dissipator, and a heat dissipator releasing the heat received from the heat conductor,
wherein at least one of the heat collector, the heat conductor and the heat dissipator comprises the graphite/graphene composite material of any of above [1] to [8], and
[15] a method of producing the graphite/graphene composite material of any of [1] to [7], the method comprising:
(1) a step of mixing flat graphite particles with graphene aggregates to obtain a mixture,
(2) a step of filling the mixture in a metal mold and stacking the flat graphite particles using the graphene aggregates as a binder so that basal surfaces of the graphite particles are overlapped with one another to obtain a stack, and
(3) a step of subjecting the stack to cutting out so that a cross section of the flat graphite particles in a stacking direction thereof appears.

Effect of the Invention

According to the present invention, a graphite/graphene composite material having good thermal conductivity and assuring that a thickness in a stacking direction can be adjusted freely can be obtained. Therefore, a thickness in a stacking direction can be made thick.

The graphite/graphene composite material of the present invention can have a high crystallinity and orientation. Further the graphite/graphene composite material of the present invention can have a high bending strength. Furthermore the graphite/graphene composite material of the present invention can have a high bulk density.

The graphite/graphene composite material of the present invention has good thermal conductivity in the in-plane direction and its thickness in the stacking direction can be made thick. Therefore, a heat collector, a heat conductor and a heat dissipator can be provided by making use of the high thermal conductivity in the in-plane direction of graphite, and a heat dissipation system comprising these heat collector, heat conductor and heat dissipator can be provided.

BRIEF DESCRIPTION OF THE DRAWINGS

FIG. 2($a$) is a result of observation, using SEM (scanning electron microscope), of a cross section of the composite material of Example 3 precisely cut with Ar (argon) ion beam using a cross section polisher SM-09010 (manufactured by JEOL Ltd.).
FIG. 2($b$) is a view showing locations of graphene aggregate in the same photo as in FIG. 2($a$).
FIG. 8 shows examples of heat-dissipation systems ((a) to (c)).

EMBODIMENT FOR CARRYING OUT THE INVENTION

Figure 1:
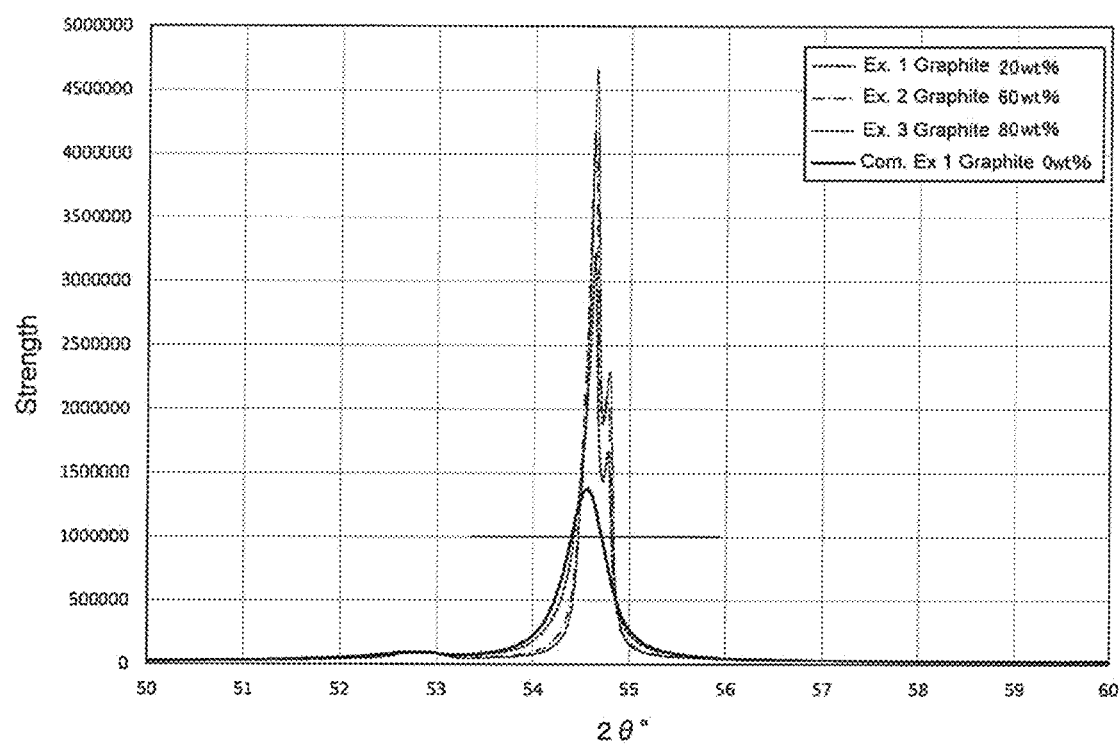
FIG. 1 is a graph showing measurement result of 004 diffraction line of graphite with respect to graphite/graphene composite material of Comparative Example 1 and Examples 1 to 3.

Hereinafter, a graphite/graphene composite material comprising flat graphite particles and graphene aggregates, in which the flat graphite particles are stacked overlapping its basal surfaces with one another using the graphene aggregates as a binder and the graphene aggregates are composed of deposited single-layer graphenes and multi-layer graphenes, will be described.

<Graphite Particles>

Graphite particles may be either of natural graphite and artificial graphite, and are in a flat form and has a basal surface and an edge surface. Here, in a graphite crystal formed by stacking carbon hexagonal planes, the basal surface is a surface where carbon hexagonal planes appear and the edge surface is a surface where edges of carbon hexagonal planes appear. Examples of usable graphite particles include flake graphite, vein graphite, earthy graphite, sheet-like graphite, kish graphite, pyrolytic graphite, highly oriented pyrolytic graphite (HOPG) and the like.

The flat shape means that when stacking graphite particles in a metal mold while appropriately evacuating the inside of the mold, the basal surfaces are naturally overlapped with one another to the extent that an orientation direction of the carbon hexagonal planes is maintained substantially uniformly.

Graphite particles have an average particle size of preferably 10 to 1000 μm, more preferably 50 to 800 μm, more preferably 100 to 400 μm, more preferably 200 to 400 μm. When the average particle size is within this range, there is a tendency that a thermal diffusion constant is increased and heat conductivity is increased. Further, a thickness of the graphite particles is preferably 1 to 50 µm, more preferably 1 to 20 µm. When the thickness of the graphite particles is within this range, orientation of the molded article tends to be enhanced.

<Graphene Aggregates>

The graphene aggregates mean an aggregate of graphenes formed by deposition of single-layer or multi-layer graphenes. As used herein, there is a case where "graphenes" include not only single-layer graphenes, but also multi-layer graphenes in such a manner as mentioned above. In this case, the multi-layer is not particularly limited as long as a property of adhesion by Van der Waals forces can be maintained, and usually is preferably not more than 100 layers, more preferably not more than 50 layers, further preferably not more than 10 layers.

Graphene aggregates can be prepared, for example, by dropped, on a filter paper, a graphene dispersion prepared by dispersing single-layer or multi-layer graphenes in a solvent including lower alcohol (e.g., isopropyl alcohol) or water and depositing the graphenes while separating the solvent. The graphene dispersion can be prepared by a variety of methods. For example, the graphene dispersion can be prepared by, after the expanded graphite obtained by heat treatment of a graphite intercalation compound was immersed in isopropyl alcohol, conducting cracking treatment with a homogenizer and further by separating a supernatant by centrifugation. Alternatively, in the above method, a starting material "expanded graphite" may be changed to "a cluster of bulky graphenes obtained by charging a starting material such as a phenolic resin powder pre-baked to an extent of containing remaining hydrogen in a graphite vessel, and subjecting the starting material together with the vessel to hot isostatic pressing treatment under an inert gas atmosphere" (WO 2011/102473). Or, "natural graphite particles (for example, high purity natural graphite powder, earthy graphite powder and the like available from SEC CARBON LIMITED and Nippon Graphite Industries, Co., Ltd.) may be used instead of a starting material "expanded graphite".

Graphene aggregates are not particularly limited as long as a size thereof is such that the basal surface of the graphite particles can be covered therewith when the graphene aggregates are mixed with the graphite particles, and typically, an average diameter thereof is preferably 1 mm or less, more preferably 850 µm or less, more preferably 710 µm or less, further preferably 500 µm or less. When the average diameter of the graphene aggregates satisfies the above conditions, there is a tendency that thermal conductivity is improved. On the other hand, a lower limit of the average diameter of the graphene aggregates is not particularly limited, and for example, if it is 1 µm or more, there is no particular problem for exhibiting the effects of the present invention. A thickness of the graphene aggregates typically is preferably less than 50 µm, more preferably less than 20 µm. When the thickness of the graphene aggregates satisfies the above conditions, there is a tendency that bonding force of the molded article is improved and a strength of the molded article is increased. A lower limit of the thickness of the graphene aggregates is not particularly limited, and usually is 0.05 µm or more.

<Graphite/Graphene Composite Material>

The graphite/graphene composite material is one obtained by stacking the flat graphite particles using the graphene aggregates as a binder so that basal surfaces of the graphite particles are overlapped with one another. A state of the graphite particles and the graphene aggregates being stacked in such a manner is illustrated in FIG. 2. Here, graphene aggregates, by strong Van der Waals forces thereof, play a role of a binder for bonding the graphite particles. In addition, when the graphene aggregates function as a binder, there can be obtained also an effect such that the bending strength of the graphite/graphene composite material is increased.

A feature of the graphite/graphene composite material, as it is clear from a preparation process mentioned later, a thickness of the stacking direction of the composite material can be easily thickened by increasing an amount of stacking. When a thickness of the stacking direction of the composite material is increased, an edge surface advantageous as a surface to be contacted with a heat source for a large amount of heat conduction is widened and enlarged, and a cross-sectional area for passing heat therethrough is increased, thereby making it possible to decrease a heat resistance and carry a large amount of heat. Such composite material is very advantageous as a material for thermal conductors such as a heat collector, a heat conductor and a heat dissipator. The thickness in the stacking direction of the graphite/graphene composite material can be adjusted arbitrarily by adjusting an amount of stacking, and it is also possible to set the thickness to be, for example, 100 µm or more, 1 mm or more, more preferably 10 mm or more.

In the graphite/graphene composite material, with respect to a blending ratio of graphite and graphene aggregates, there is a tendency that as the amount of graphite increases, a heat transfer rate increases, crystallinity (half value width 2θ) becomes larger and a bulk density is increased. In addition, a bending strength is reduced. On the other hand, when an amount of graphene aggregates becomes larger, the tendency is reversed. A mixing ratio of graphite and graphene aggregate is not particularly limited and may be selected appropriately depending on application characteristics based on the tendency described above, typically a mass ratio of the graphite particles to the total weight of the graphite particles and the graphene aggregates is preferably 1 to 99% by mass, more preferably 20 to 95% by mass, further preferably 40 to 90% by weight.

In the graphite/graphene composite material, the half value width 2θ is preferably less than 0.3°, more preferably less than 0.25°. When the half value width satisfies these conditions, there is a tendency that a thermal diffusion constant of the composite material is improved and a heat conductivity increases. Here, the half value width 2θ is a width value of a diffraction angle 2θ at a height of 50% of a peak in an X-ray diffraction intensity curve, and corresponds to a size of a crystal and orientation. With respect to the bending strength, for example, a strength at 80% natural graphite is about two times larger than a strength at 100% natural graphite, and based on this, the strength of the graphite/graphene composite can be appropriately adjusted. It can be considered that this increase of a bending strength is based on a binder force of the graphene aggregates.

In the graphite/graphene composite material, a bulk density is preferably 1.90 g/cm$^3$ or more, more preferably 1.95 g/cm$^3$ or more, further preferably 2.00 g/cm$^3$ or more, further preferably 2.05 or more, further preferably 2.1 g/cm$^3$ or more. When the bulk density satisfies these conditions, there is a tendency that the heat conductivity is increased. Here, the bulk density is a value calculated from a volume calculated from measured dimensions of the composite material and a weight actually measured.

<Production Method>

Graphite graphene composite material can be produced by mixing flat graphite particles and graphene aggregates and then molding a mixture.

(Mixing)

A mixing method is not particularly limited, and the mixing can be carried out by a usual method, for example, by compounding graphite particles and graphene aggregates at a predetermined compounding ratio and then mixing by using a ball mill or the like. Further, the graphite/graphene composite material can be produced by a method of, in a state of graphenes being dispersed in a solvent such as an alcohol in a manufacturing process of graphene aggregates, adding graphite particles in the solvent and mixing, and then separating the solvent, (Molding)

Molding of the thus obtained mixture can be carried out by using a metal mold corresponding to a shape of a composite material to be obtained as a target product, and filling the mixture in the mold and then applying a load as desired. By such an operation, the molded article (stacked article), in which the above flat graphite particles are stacked using the graphene aggregates as a binder, can be obtained. In this case, it is preferable that the mold is one having a vacuum evacuator, and it is preferable that the mold is one having a heating mechanism so that hot press can be carried out by application of heat during load molding. Examples of the applicable molding method include various molding methods such as compression molding, inflation molding, Engel molding, extrusion molding, extrusion lamination molding, rotational molding, calendar molding, injection molding, vacuum forming, stamping, spray up molding, slush molding, lamination molding, cast molding, injection molding, hand lay-up molding, low-pressure molding, transfer molding, foam molding, hand lay-up method, filament winding method, blow molding, powder molding, matched-die molding, SMC method (sheet molding compound) and T-die method.

The molded article (stacked article) of graphite graphene composite material thus formed into a predetermined shape using a metal mold and the like is cut into a molded article of a desired thickness by optionally cutting out (slicing) so that a stacking direction of the flat graphite particles becomes a cross section as shown in Examples 20, 24 and 25. Such a thickness is not particularly limited, and is, for example, 0.1 to 500 mm, 1 to 200 mm. According to such cut-out processing, it is possible to obtain a molded article, in which graphite and graphenes are oriented in any direction and/or at any thickness while a stacking direction of flat graphite particles appears in a cross-section of the molded article. Further, for example, by previously preparing a thick block-shaped stacked article, it is also possible to produce flaky articles in increments of 100 sheets at a time, and in this case, it is very efficient. Such cut-out processing can be suitably carried out using a multi-wire saw or the like.

In the case where the mold comprises a vacuum evacuator, it is preferable to adjust a degree of vacuum in the mold to be below 100 Pa before load molding. Also, when the mold is provided with a heating mechanism, it is preferable to set a temperature of the mold to be 50° C. or more prior to the load molding. A load for the load molding is preferably 2 to 100 kN/cm$^2$, more preferably 10 to 30 kN/cm$^2$. A time of the load molding is preferably 0.5 to 20 minutes, more preferably from 1 to 5 minutes.

Further, the graphite graphene composite material can be produced also by another production method, for example, by molding expanded graphite obtained by heat treatment of a graphite intercalation compound as it is. This is because the expanded graphite comprises both of flat graphite particles and graphene aggregates which are starting materials of the graphite graphene composite material. The method of forming in this case is as described above.

<Application>

The thus obtained graphite/graphene composite material is very useful as a material for a thermal conductor such as a heat collector, a heat conductor, a heat dissipator or the like. Because, an edge surface which is advantageous as a surface to be contacted with a beat source for quick conduction of a large amount of heat while maintaining an excellent thermal conductivity in an in-plane direction of the graphite crystal can be made wide and large.

Also, in the case of smartphones, tablet PC, HMD (head mounted display), wearable devices such as watch type and the like, while it is necessary to install a heat dissipation system in a limited space, the graphite/graphene composite material can be suitably designed to be integrated with a housing of a resin, a metal, a rubber or the like in these devices. Further, the graphite/graphene composite material can also be installed on a case such as a smartphone case and a tablet PC case which is different from a device. In the case of integrating the graphite/graphene composite material with a housing composed of a resin, a metal, a rubber or the like or in the case of installing the graphite/graphene composite material on a case, for example, it is effective to absorb internal heat by one surface of the graphite/graphene composite material and release the heat from the opposite surface thereof. As a method of integrating the housing with the graphite/graphene composite material, insert molding of a resin to the composite material, molding by casting of a resin, rubber or the like, compression molding and the like can be effectively used. Also, it can be carried out appropriately to increase a strength of a surface of the graphite/graphene composite material or coat the surface with an insulation film. It is also possible to add an effect of shielding electromagnetic waves by adding, in a resin or a rubber or in a coating layer when coating at the time of integration, a metal powder, a metal fiber, a metal whisker, a magnetic powder, a magnetic fiber, magnetic whiskers, a carbon powder, a carbon fiber, a nano-carbon material, etc.

Application of the graphite/graphene composite material as a material for thermal conductors and application to a heat dissipation system using the graphite/graphene composite material are shown in Examples, and also other applications are all within the scope of the present invention.

(Heat Collector)

In the application of the graphite/graphene composite material to a heat collector, for example, by disposing a wide and large edge face of the graphite thereof so as to come into contact with a heat source, compared to a case of bringing a basal surface into contact with a heat source, a heat collector capable of efficiently absorbing heat from a heat source can be obtained. Further, by adding an appropriate flexibility, the surface of the heat collector follows unevenness of the surface of a heating element, and a contact surface area increases, thereby enabling heat transferring performance to be increased due to decrease of voids. Examples of usable flexible materials for imparting flexibility include rubber materials such as isoprene rubber, butadiene rubber, styrene-butadiene rubber, chloroprene rubber, nitrile rubber, polyisobutylene rubber, ethylene propylene rubber, chlorosulfonated polyethylene rubber, acrylic rubber, fluorine-containing rubber, epichlorohydrin rubber, urethane rubber, silicone rubber and Teflon rubber. These flexible materials can be used alone or can be used in suitable combination thereof. Further, heat conductivity of the flexible material portion can be increased by adding thermally conductive fillers such as graphene aggregates, metal particles, metal fibers, carbon fibers, alumina, aluminum nitride, silicon carbide and zinc oxide in the rubber material.

(Heat Conductor/Heat Dissipator)

In the application of the graphite/graphene composite material to a heat conductor, for example, the graphite/graphene composite material can be combined with a metal (e.g., aluminum, copper, magnesium, gold, silver, stainless steel, iron and steel, tin, solder, etc.) having good thermal conductivity in order to compensate for poor heat transfer in a stacking direction of the graphite. For example, by embedding a metal in the composite material, a heat conductor covering up poor heat transfer in the stacking direction by the metal and making use of excellent thermal conductivity in the in-plane direction of the graphite crystal can be obtained. Thus, the metal embedded in the composite material is referred to as a metallic core. Similar metal-embedded composite material is also used as a heat dissipator (or a heat sink). That is, when covering up poor heat transfer in the stacking direction by a metal, a heat dissipator (or a heat sink) having excellent heat transfer property in either of the in-plane direction and the stacking direction of the graphite crystal can be obtained. In contrast with that, it is also possible to embed the composite material to a metal. Further the shape of the metal can be selected from a columnar, spherical, fibrous and particulate forms according to necessity. The metal is also useful for reinforcing the graphite/graphene composite material if the metal is configured to reinforce the strength of the graphite/graphene composite material.

Furthermore, non-limiting examples of combination material comprising the graphite/graphene composite material and the metal include one, in which the entire periphery of the composite material is surrounded by a metal, one, in which metal sheets are bonded to front and back surfaces of the composite material, one, in which the composite material in a predetermined form (e.g., a form of fin, etc.) is bonded to a surface of a metal sheet, one, in which predetermined dents are provided on a surface of a metal sheet and the composite material in a predetermined form (e.g., a form of fin, etc.) is fitted to the dents and the like. The abovementioned combination with a metal can also be applied similarly to a heat collector.

(Heat-Dissipation System)

Furthermore, a heat dissipation system having unprecedented excellent heat dissipation characteristic can be obtained by using at least one of the heat collector, the heat conductor and the heat dissipator produced using the graphite/graphene composite material of the present invention. Here, the heat dissipation system corresponds to any one which transfers heat from a heating element, dissipates heat from a heating element to a space, or draws heat from a heating element by convection by a gas or a liquid, and it means that the heat dissipation system also includes, for example, a cooling system. That is, the heat dissipation system essentially has a purpose of transferring heat, and may be a cooling system for cooling a target site in combination with a cooling device.

<Coating Layer>

A coating layer may be applied to the whole or a part of an outer surface of the graphite/graphene composite material depending on the purpose. Examples of such a coating layer include an insulating film, a high impact film and the like.

(Insulating Film)

In electronic elements, devices and IT equipment that require a heat dissipation system, there is a case where insulating treatment for preventing a short circuit of an electrical circuit is necessary depending on a site of use. In such a case, an insulating film (an insulating coating layer) can be provided on a surface of the graphite/graphene composite material or on a surface of a heat collector, a heat conductor, a heat dissipator or the like composed of the graphite/graphene composite material. The insulating film can be one comprising one or more selected from common resins, ceramics and glass used in the art. For example, these can be used alone, or ceramics and glass may be blended to a resin, or a resin coating layer and a ceramic coating layer may be laminated. In this case, the insulating film may be applied to the whole or a part of an outer surface of the graphite/graphene composite material, for example, a portion coming into contact with a heating element may be subjected to masking, and the insulating film may be applied to other portion than the portion coming into contact with the heat generating portion. Further, in order to enhance heat dissipation performance while maintaining the insulating property, black carbon black having a high emissivity and the like may be added to the insulating film.

(High Impact Film)

In electronic components loaded on a vehicle and the like, it is common that sufficient impact resistance is required for parts and members thereof. In such cases, a high impact film (a high impact coating layer) prepared using a resin common in the art can be provided on a surface of the graphite/graphene composite material or on a surface of a heat collector, a heat conductor, a heat dissipator or the like composed of the graphite/graphene composite material. The high impact film can be one comprising one or more selected from common resins, ceramics, glass and metals used in the art. For example, these can be used alone, or ceramics and glass may be blended to a resin, or a resin coating layer and a ceramic coating layer may be laminated. In this case, the high impact film may be applied to the whole or a part of an outer surface of the graphite/graphene composite material in the same manner as in the insulating film.

Any of resins commonly used in this field can be used as a resin for the insulating film and the high impact film. Examples thereof include thermosetting resins such as phenol resin, epoxy resin, melamine resin, urea resin, unsaturated polyester resin, alkyd resin, polyurethane and thermosetting polyimide; thermoplastic resins such as polyethylene, polypropylene, polyvinyl chloride, polyvinylidene chloride, polystyrene, polyvinyl acetate, Teflon resin, ABS resin, AS resin, and acrylic resin; and engineering reins such as polyamide, nylon, polyacetal, polycarbonate, modified polyphenylene ether, polyethylene terephthalate and polybutylene terephthalate. Any of ceramics commonly used in this field can be used as the ceramic, and the same can be said for glass and metal. Particularly metals having good thermal conductivity (e.g., aluminum, copper, magnesium, gold, silver, stainless steel, iron and steel, tin, solder, etc.) are preferred.

(Coating)

When coating with a resin, there is, for example, a coating method of preparing a coating solution obtained by mixing a resin in a solvent such as water, alcohol or thinner and coating the coating solution by a general-purpose method such as a dip coating method, a bar coating method or a spray coating method. Furthermore, glass, ceramics and the like may be mixed to the coating solution, if necessary. It is possible to obtain a more highly insulating film or a higher impact resistance film by a combination use of ceramic and glass with a resin. Alternatively, in the case of combination use of a resin and ceramics, coating may be conducted, for example, by using a combination of a resin film and a ceramic film, and adhering these films to an outer surface for lamination. On the other hand, when using ceramics, glass, metals and the like, a coating method usually used in this field can be used. For example, sputtering, chemical vapor deposition (CVD), ion plating, thermal spraying, and vapor deposition are included in such a coating method.

EXAMPLE

The present invention is then described by means of Examples, but is not limited to these Examples. While excellent thermal conductivity of the graphite/graphene composite material is obvious based on well-known nature of graphite, measurement of thermal conductivity itself is difficult. Therefore, in the following Examples, surface resistance (electrical conductivity) is measured instead and used as an index for thermal conductivity.
<Materials Used>
Graphite intercalation compound with sulfuric acid: EPX-60M (manufactured by Nippon Graphite Industries, Co., Ltd.)
Natural graphite particles: Graphite particles obtained by classifying high purity natural graphite SNO (manufactured by SEC CARBON LIMITED)
Graphite particles 1: average particle size 50 µm, thickness adjusted to 1 to 20 µm
Graphite particles 2: average particle size 100 µm, thickness adjusted to 1 to 20 µm
Graphite particles 3: average particle size 200 µm, thickness adjusted to 1 to 20 µm
Graphite particles 4: average particle size 400 µm, thickness adjusted to 1 to 20 µm
Graphite particles 5: average particle size 400 µm, thickness adjusted to 1 to 50 µm (available from Nippon Graphite Industries, Co., Ltd.)
GF-1 (Graphite film): PGS graphite sheet (PGOS-17) (Panasonic Corporation), thickness 17 µm
GF-2 (Graphite film): PGS graphite sheet (PGS-25) (Panasonic Corporation), thickness 25 µm
GF-3 (Graphite film): PGS graphite sheet (POS-70) (Panasonic Corporation), thickness 75 µm
GS1-1 (Graphite sheet): eGRAF (SS500) (available from TOMOE Engineering Co., Ltd.), thickness 99 µm
GS1-2 (Graphite sheet): eGRAF (SS500) (available from TOMOE Engineering Co., Ltd.), thickness 197 µm
GS1-3 (Graphite sheet): eGRAF (SS500) (available from TOMOE Engineering Co., Ltd.), thickness 286 µm
GS2-1 (Graphite sheet): eGRAF (SS600) (available from TOMOE Engineering Co., Ltd.), thickness 142 µm
GS2-2 (Graphite sheet): eGRAF (SS600) (available from TOMOE Engineering Co., Ltd.), thickness 252 µm
GS2-3 (Graphite sheet): eGRAF (SS600) (available from TOMOE Engineering Co., Ltd.), thickness 426 µm
<Preparation of Graphene Aggregates>
(Graphene Aggregates 1)
<<Graphene Dispersion 1>>
Into a ceramic crucible was charged 200 g of graphite intercalation compound with sulfuric acid, and the crucible was put in an electric oven set to an oven temperature of 800° C., followed by keeping for five minutes to obtain 160 g of expanded graphite by expanding graphite particles by several hundred times in a thickness direction. The obtained expanded graphite was collected in a 100 cm$^3$ aluminum measuring cup, and an excess expanded graphite was removed by leveling of a top portion of the cup with a glass rod having an outer diameter of 10 mm to obtain a volume of 100 cm$^3$. Then, a weight of 100 cm$^3$ of the expanded graphite was measured using an electronic balance HTR-80 for analysis (manufactured by SHINKO DENSHI CO., Ltd., accuracy of analysis: 0.1 mg), and a tap density was determined by dividing the measured value by 100 cm$^3$, and the tap density was 0.028 g/cm$^3$.

Then, after dipping 160 g of the obtained expanded graphite into 5000 g of isopropyl alcohol in a glass beaker, the expanded graphite was subjected to shredding treatment at 12500 rpm for 15 minutes using a universal homogenizer (Physcotron NS52 manufactured by Microtec Co., Ltd.), and the shredding treatment was repeated 20 times. An ultrasonic wave oscillator of an ultrasonic homogenizer (US300T manufactured by Nippon Seiki Co., ltd.) was put into the obtained material after shredding treatment, and the material was subjected to ultrasonic treatment at an output of 70% for 10 minutes, and the ultrasonic treatment was repeated 20 times to convert the expanded graphite particles into graphenes. An obtained graphene solution was dispensed in a glass tube for centrifuging and was subjected to centrifuging treatment at 1000 rpm for 10 minutes using a centrifugal separator (SS2000 manufactured by Kabushiki Kaisha Sakuma Seisakusho) and a supernatant was collected to obtain Graphene Dispersion 1. 50 Grams of the obtained graphene dispersion was collected in an aluminum cup, a surface of which had been subjected to alumite treatment, and a weight of a solid after having been kept at 90° C. for 20 hours was measured. A solid content was calculated to the weight of the dispersion, which was 1.5 wt %.
<<Deposition and Pulverization>>
A filter paper (quantitative filter paper 5A manufactured by Toyo Roshi Kaisha Ltd.) was put on a Buchner funnel and while reducing a pressure with an aspirator, the Graphene Dispersion 1 obtained above was slowly added on the filter paper dropwise to separate the graphene from isopropyl alcohol and deposit the graphene on the filter paper. After air drying at room temperature for five hours, the deposited graphene was dried in an electric oven set at 90° C. for eight hours to fully remove isopropyl alcohol and thus, graphene aggregates were obtained. The graphene aggregates after the drying was pulverized into coarse particles for a pulverizing time of 15 minutes using a universal pulverizer (M20 manufactured by AS ONE Corporation).
(Graphene Aggregates 2)
<<Graphene Dispersion 2>>

A phenolic resin powder (BELLPEARL S830 available from AIR WATER INC.) was filled in a graphite container, and while flowing nitrogen gas in a flowing rate of 2 liters/min, the phenolic resin powder was baked at a maximum ultimate temperature of 600° C. The baked powder was sealed in a graphite container having an inner diameter of 80 mm×an outer diameter of 95 mm and a height of 150 mm and was subjected to pressing and heating treatment at a maximum ultimate temperature of 1400° C. at a maximum ultimate pressure of 190 MPa using hot isostatic pressing equipment. A large amount of multi-layer graphenes having a size of 2 to 10 µm and a thickness of 1 to 2 nm was generated on a surface of the treated powder, and thus a cluster of graphenes having a bulky form was obtained. After dipping 160 g of the cluster of graphenes having a bulky form into 5000 g of isopropyl alcohol in a glass container, the cluster of graphenes was subjected to shredding treatment at 12500 rpm for 15 minutes using a universal homogenizer (Physcotron NS52) manufactured by Microtec Co., Ltd., and the shredding treatment was repeated 5 times.

An ultrasonic wave oscillator of an ultrasonic homogenizer US300T manufactured by Nippon Seiki Co., ltd. was put into the obtained material after shredding treatment, and the material were subjected to ultrasonic treatment at an output of 70% for 10 minutes, and the ultrasonic treatment was repeated 3 times to extract the graphenes from the cluster of graphenes. An obtained graphene solution was dispensed in a glass tube for centrifuging and was subjected to centrifuging treatment at 1000 rpm for 10 minutes using a centrifugal separator SS2000 manufactured by Kabushiki Kaisha Sakuma Seisakusho and a supernatant was collected to obtain Graphene Dispersion 2. 50 Grams of the obtained graphene dispersion was collected in an aluminum cup, a surface of which had been subjected to alumite treatment, and a weight of a solid after having been kept at 90° C. for 20 hours was measured. A solid content was calculated to the weight of the dispersion, which was 0.2 wt %.

<<Deposition and Pulverization>>

Graphene aggregates were obtained in the same manner as in the preparation of Graphene aggregates 1 except that Graphene dispersion 2 was used instead of Graphene dispersion 1 as a starting material. The thus obtained graphene aggregates were pulverized into coarse particles similarly.

(Graphene Aggregates 3)

<<Graphene Dispersion 3>>

After dipping 160 g of natural graphite particles (manufactured by Nippon Graphite Industries, Co., Ltd.) into 5000 g of isopropyl alcohol in a glass container, an ultrasonic wave oscillator of an ultrasonic homogenizer US300T manufactured by Nippon Seiki Co., ltd. was put into the container, and the graphite particles were subjected to ultrasonic treatment at an output of 70% for 10 minutes, and the ultrasonic treatment was repeated 30 times to convert the graphite particles into graphenes. An obtained graphene solution was dispensed in a glass tube for centrifuging and was subjected to centrifuging treatment at 1000 rpm for 10 minutes using a centrifugal separator 832000 manufactured by Kabushiki Kaisha Sakuma Seisakusho and a supernatant was collected to obtain Graphene Dispersion 3. 50 Grams of the obtained graphene dispersion was collected in an aluminum cup, a surface of which had been subjected to alumite treatment, and a weight of a solid after having been kept at 90° C. for 20 hours was measured. A solid content was calculated to the weight of the dispersion, which was 0.08 wt %.

<<Deposition and Pulverization>>

Graphene aggregates were obtained in the same manner as in the preparation of Graphene aggregates 1 except that Graphene dispersion 3 was used instead of Graphene dispersion 1 as a starting material. The thus obtained graphene aggregates were pulverized into coarse particles similarly.

(Graphene Aggregates 4 to 7)

<<Classification>>

Graphene aggregates (coarse particles) in a state that relatively large particles remain were prepared in the same manner as in the preparation method of Graphene aggregates 1 except that a pulverizing time of a universal pulverizer was changed from 15 minutes to 5 minutes in the preparation of graphene aggregates.

Then, graphene aggregates having passed each of sieves having an aperture of 1 mm, 850 μm, 710 μm and 500 μm were classified into graphene aggregates having an average diameter of less than 1 mm (Graphene aggregates 4), graphene aggregates having an average diameter of less than 850 μm (Oraphene aggregates 5), graphene aggregates having an average diameter of less than 710 μm (Graphene aggregates 6) and graphene aggregates having an average diameter of less than 500 μm (Graphene aggregates 7).

Comparative Example 1 and Examples 1 to 13

Each sample was prepared in accordance with the formulation shown in Table 1.

<Mixing of Graphite Particles and Graphene Aggregates>

Namely, graphite particles and graphene aggregates were mixed in a predetermined formulation and after charging a mixture into a wide mouthed plastic bottle, the bottle was rotated at 240 rpm for 20 minutes using a portable ball mill to mix the mixture sufficiently.

<Molding>

The thus obtained 0.2 to 0.3 g of mixture was charged into a metal mold in a coin shape having an outer diameter of 14 mm and having a vacuum evacuator. After charging of the mixture into the metal mold, the metal mold was held on a heated plate of a hot press manufactured by Sansho Industry Co., Ltd. and set at 90° C. and was pre-heated and the inside of the metal mold was evacuated. After confirming that a vacuum degree inside the metal mold had reached 20 Pa, hot press molding was carried out with a 45 kN load for a predetermined time. After the molding, the sample was taken out from the metal mold, and burr of the molded article was removed. Then, a thickness of the molded article was measured with a Degimatic Outside Micrometer (manufactured by Mitsutoyo Corporation) having a measurement accuracy of 1 μm and an outer diameter of the molded article was measured with a Super caliper (manufactured by Mitsutoyo Corporation) having a measurement accuracy of 10 μm to calculate a volume of the molded article. Then, a weight of the molded article was measured with a precision electronic balance (manufactured by AS ONE Corporation) having a measurement accuracy of 1 mg, and a bulk density was calculated by dividing the weight by the volume. The result is shown in Table 1.

<Evaluation>

(Surface Resistance)

A surface resistance of a molded article after measurement of a weight was measured with a 4-terminal 4-pin constant current applying meter (Loresta MCP-T370) manufactured by Mitsubishi Chemical Analytech Co., Ltd. The results are shown in Table 1.

(Half Value Width of 004 Diffraction Line of Graphite)

With respect to an X-ray diffraction pattern of each composite material, a 004 diffraction line of graphite was measured in a range of an angle (2θ) of diffraction of from 50 to 60° by fixing a sample with a glass holder to make a position of a surface of the sample constant using SmartLab 9 kW manufactured by Rigaku Corporation using CuKα target. The measured X-ray diffraction patterns are shown in FIG. 1 for comparison. A half value width of the 004 diffraction line of graphite was measured from the measured X-ray diffraction pattern, and is shown in Table 1.

(Bending Strength)

A load was applied gradually to a composite material using a measuring stand MX2-2500N provided with a bending jig GA5000N and manufactured by IMADA CO., LTD., and a maximum load applied to the sample was measured using Digital Force Gauge ZTA-2500N. A maximum stress (MPa) corresponding to the bending strength was calculated from the measured maximum load, outer dimensions and thickness of the sample. The results are shown in Table 1.

It had been confirmed that as a ratio of the natural graphite increased, the bending strength decreased, and there was an about two times difference in a bending strength between 100% of natural graphite and 80% of natural graphite. From this, it can be considered that a binding force of graphene aggregates result in a higher bending strength.

(SEM Observation)

A cross section of the composite material of Example 3 was cut accurately with Ar ion beam using a cross section polisher SM-09010 (manufactured by JEOL Ltd.) and was observed with SEM. The results are shown in Table 2. While FIGS. 2(a) and 2(b) are the same photos, FIG. 2(b) shows locations of graphene aggregate in FIG. 2(a). As it can be seen clearly from FIG. 2(b), a structure of the material is formed such that graphite particles are sandwiched by graphene aggregates, and a composite structure in which large size particles of graphite being excellent in crystallinity are bonded by graphenes without using a binder component.

TABLE 1

|  | Com. Ex. | Example | | | | | |
|---|---|---|---|---|---|---|---|
|  | 1 | 1 | 2 | 3 | 4 | 5 | 6 |
| Composition (wt %) | | | | | | | |
| Graphene aggregates 1 (expanded graphite) | 100 | 80 | 40 | 20 | 20 | 20 | 20 |
| Graphene aggregates 2 (HIP-treated) | — | — | — | — | — | — | — |
| Graphene aggregates 3 (supersonic treatment) | — | — | — | — | — | — | — |
| Graphene aggregates 4 (<1 mm) | — | — | — | — | — | — | — |
| Graphene aggregates 5 (<850 μm) | — | — | — | — | — | — | — |
| Graphene aggregates 6 (<710 μm) | — | — | — | — | — | — | — |
| Graphene aggregates 7 (<500 μm) | — | — | — | — | — | — | — |
| Graphite particles 1 (50 μm) | — | — | — | — | 80 | — | — |
| Graphite particles 2 (100 μm) | — | — | — | — | — | 80 | — |
| Graphite particles 3 (200 μm) | — | — | — | — | — | — | 80 |
| Graphite particles 4 (400 μm) | — | 20 | 60 | 80 | — | — | — |
| Metal mold | coin shape (outer diameter 14 mm) | | | | | | |
| Hot press time (min) | 5 | | | | | | |
| Composite material | | | | | | | |
| Thickness (mm) | 0.620 | 0.668 | 0.630 | 0.744 | 0.611 | 0.612 | 0.612 |
| Bulk density (g/cm$^3$) | 1.92 | 1.96 | 2.07 | 2.18 | 2.21 | 1.95 | 2.05 |
| Surface resistance (Ω/□) | 2.85E-2 | 2.03E-2 | 1.18E-2 | 8.38E-3 | 7.39E-3 | 2.50E-2 | 1.12E-2 |
| Half value width (2θ) | 0.524 | 0.275 | 0.204 | 0.181 | 0.147 | — | — |
| Bending strength (Mpa) | 20 | 14 | 10 | 8 | 6 | — | — |

|  | Example | | | | | | |
|---|---|---|---|---|---|---|---|
|  | 7 | 8 | 9 | 10 | 11 | 12 | 13 |
| Composition (wt %) | | | | | | | |
| Graphene aggregates 1 (expanded graphite) | — | — | — | — | — | — | — |
| Graphene aggregates 2 (HIP-treated) | 20 | — | 20 | — | — | — | — |
| Graphene aggregates 3 (supersonic treatment) | — | 20 | — | — | — | — | — |
| Graphene aggregates 4 (<1 mm) | — | — | — | 20 | — | — | — |
| Graphene aggregates 5 (<850 μm) | — | — | — | — | 20 | — | — |
| Graphene aggregates 6 (<710 μm) | — | — | — | — | — | 20 | — |
| Graphene aggregates 7 (<500 μm) | — | — | — | — | — | — | 20 |
| Graphite particles 1 (50 μm) | — | — | — | — | — | — | — |
| Graphite particles 2 (100 μm) | — | — | — | — | — | — | — |
| Graphite particles 3 (200 μm) | — | — | — | — | — | — | — |
| Graphite particles 4 (400 μm) | 80 | 80 | 80 | 80 | 80 | 80 | 80 |
| Metal mold | coin shape (outer diameter 14 mm) | | | | | | |
| Hot press time (min) | 5 | 6 | 6 | 7 | 7 | 7 | 7 |
| Composite material | | | | | | | |
| Thickness (mm) | 0.612 | 0.732 | 0.783 | 0.732 | 0.715 | 0.722 | 0.732 |
| Bulk density (g/cm$^3$) | 2.12 | 2.20 | 2.16 | 1.98 | 2.05 | 2.12 | 2.17 |
| Surface resistance (Ω/□) | 9.78E-3 | 7.85E-3 | 8.55E-3 | 1.89E-2 | 1.23E-2 | 8.99E-3 | 8.34E-3 |
| Half value width (2θ) | — | — | — | — | — | — | — |
| Bending strength (Mpa) | — | — | — | — | — | — | — |

Examples 2-1 to 2-2, Examples 3-1 to 3-5 and Examples 4-1 to 4-5

Each composite material was produced in the same manner as in the above-mentioned production of composite materials except that a thickness of each of the composite material was set as shown in Table 2. Each composite material was evaluated in accordance with the above-mentioned methods. The results are shown in Table 2.

Figure 3:
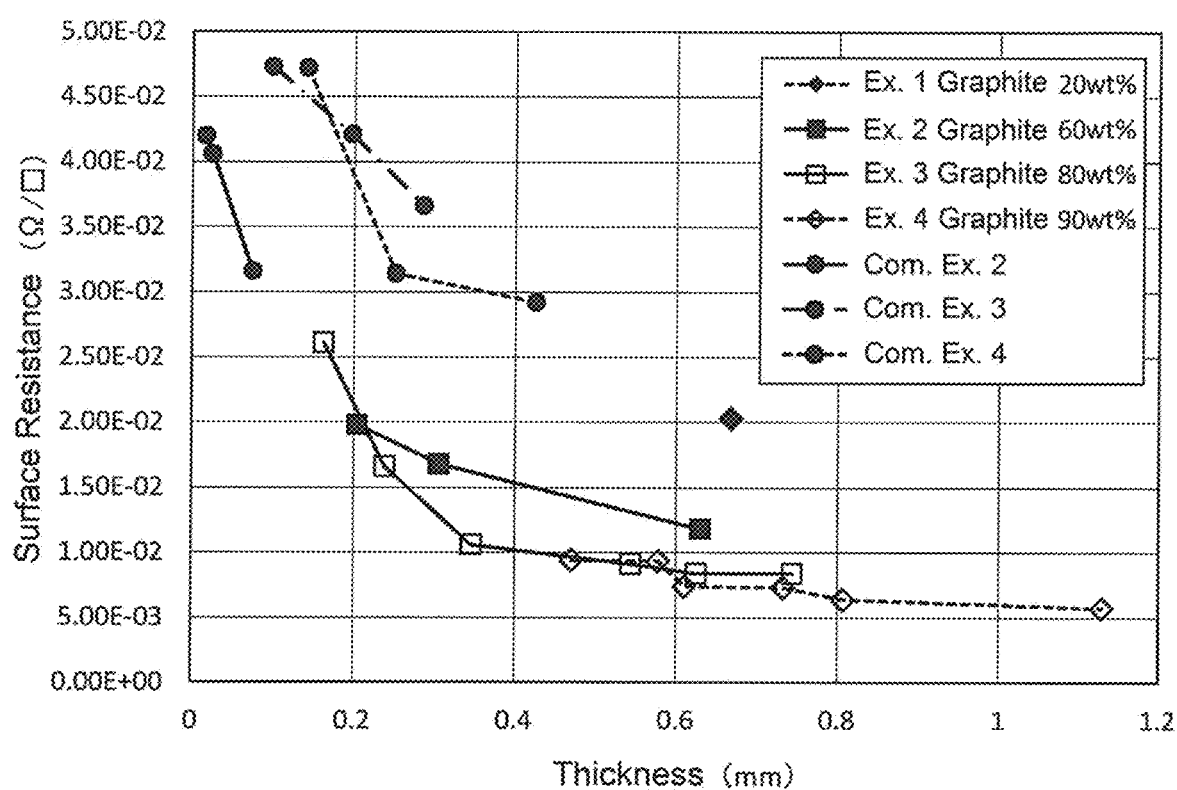
FIG. 3 is a graph showing a relation of surface resistance to thickness of the composite materials of Examples and the materials of Comparative Examples based on the results of Tables 2 and 3.

With respect to the composite materials of Examples and materials of Comparative Examples, a relation between thickness and surface resistance was plotted based on the results of Tables 2 and 3, and is shown in FIG. 3.

Examples 14 to 16

Figure 4:
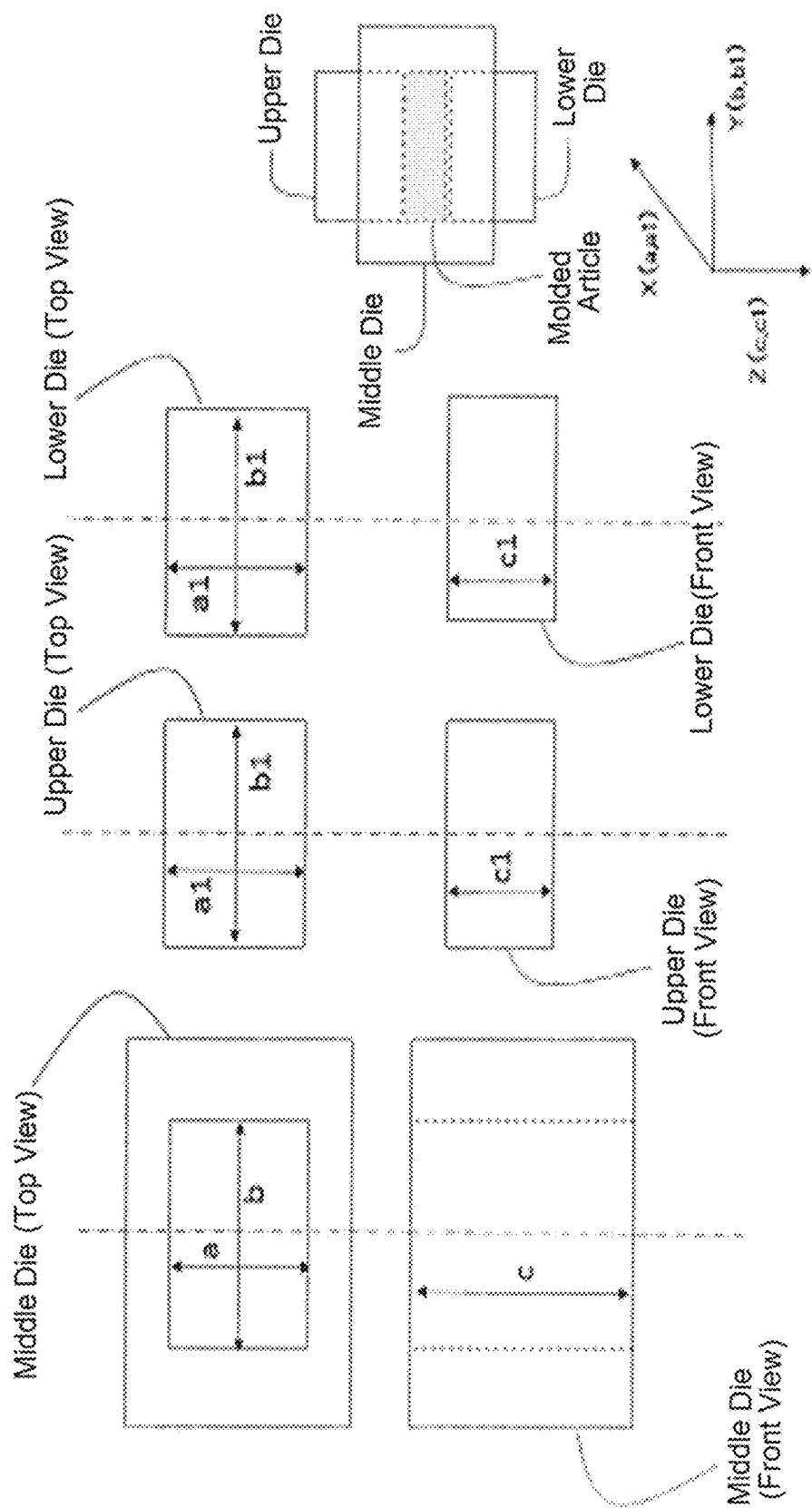
FIG. 4 shows top views and front views of metal molds (upper dies, middle dies and lower dies) used for molding of graphite/graphene composite materials of Examples 14 to 16, and a view showing a combination of these upper dies, middle dies and lower dies for molding.

Molded articles having a predetermined orientation specified from Table 5 and FIG. 4 were obtained in accordance

TABLE 2

| | Example | | | | | | | |
|---|---|---|---|---|---|---|---|---|
| | 1 | 2 | 2-1 | 2-2 | 3 | 3-1 | 3-2 | 3-3 |
| Composition (wt %) | | | | | | | | |
| Graphene aggregates 1 (expanded graphite) | 80 | 40 | 40 | 40 | 20 | 20 | 20 | 20 |
| Graphite particles 4 (400 μm) | 20 | 60 | 60 | 60 | 80 | 80 | 80 | 80 |
| Metal mold | coin shape (outer diameter 14 mm) | | | | | | | |
| Hot press time (min) | 5 | | | | | | | |
| Composite material | | | | | | | | |
| Thickness (mm) | 0.668 | 0.630 | 0.205 | 0.306 | 0.744 | 0.163 | 0.239 | 0.346 |
| Bulk density (g/cm$^3$) | 1.96 | 2.07 | 1.74 | 1.98 | 2.18 | 2.19 | 2.18 | 2.12 |
| Surface resistance (Ω/□) | 2.03E−02 | 1.18E−02 | 1.98E−02 | 1.68E−02 | 8.38E−03 | 2.61E−02 | 1.66E−02 | 1.06E−02 |

| | Example | | | | | | | |
|---|---|---|---|---|---|---|---|---|
| | 3-4 | 3-5 | 4 | 4-1 | 4-2 | 4-3 | 4-4 | 4-5 |
| Composition (wt %) | | | | | | | | |
| Graphene aggregates 1 (expanded graphite) | 20 | 20 | 10 | 10 | 10 | 10 | 10 | 10 |
| Graphite particles 4 (400 μm) | 80 | 80 | 90 | 90 | 90 | 90 | 90 | 90 |
| Metal mold | coin shape (outer diameter 14 mm) | | | | | | | |
| Hot press time (min) | 5 | | | | | | | |
| Composite material | | | | | | | | |
| Thickness (mm) | 0.544 | 0.625 | 0.611 | 0.471 | 0.578 | 0.733 | 0.807 | 1.131 |
| Bulk density (g/cm$^3$) | 2.09 | 2.2 | 2.21 | 2.14 | 2.23 | 2.13 | 2.22 | 2.22 |
| Surface resistance (Ω/□) | 9.11E−03 | 8.38E−03 | 7.39E−3 | 9.43E−3 | 9.34E−3 | 7.30E−3 | 6.39E−3 | 5.71E−3 |

Comparative Examples 2-1 to 2-3, Comparative Examples 3-1 to 3-3 and Comparative Examples 4-1 to 4-3

Commercially available graphite films (the above-mentioned GF-1 to GF-3) and graphite sheets (the above-mentioned GS1-1 to GS1-3 and GS2-1 to GS2-3) were cut out in an outer diameter of 14 mm to obtain comparative samples. A thickness, an outer diameter and a weight were measured and a bulk density was calculated in the same manner as in Examples. A surface resistance was measured in accordance with the above-mentioned method. The results are shown in Table 3.

with formulations shown in Table 4 using Graphene aggregates 1 (expanded graphite) and Graphite Particles 4 (400 μm) (namely molded articles of XY, YZ and ZX types).

<Mixing of Graphite Particles and Graphene Aggregates>

Mixing was performed in the same manner as in the above-mentioned method.

<Molding>

The thus obtained mixture of 36 g was subjected to molding in the same manner as in the above-mentioned method in accordance with the formulations shown in Table 4. The mold used was any predetermined one shown in Table 5 and FIG. 4 (namely either of XY, YZ and ZX types. Any of these types comprises an upper die, middle die and lower

TABLE 3

| | Comparative Example | | | | | | | | |
|---|---|---|---|---|---|---|---|---|---|
| | 2-1 | 2-2 | 2-3 | 3-1 | 3-2 | 3-3 | 4-1 | 4-2 | 4-3 |
| Graphite film/graphite sheet used | GF-1 | GF-2 | GF-3 | GS1-1 | GS1-2 | GS1-3 | GS2-1 | GS2-2 | GS2-3 |
| Composite material | | | | | | | | | |
| Thickness (mm) | 0.017 | 0.025 | 0.075 | 0.099 | 0.197 | 0.286 | 0.142 | 0.252 | 0.426 |
| Bulk density (g/cm$^3$) | 2.11 | 1.945 | 1.47 | 1.98 | 1.95 | 1.84 | 1.75 | 1.70 | 1.79 |
| Surface resistance (Ω/□) | 4.20E−2 | 4.06E−2 | 3.16E−2 | 4.73E−2 | 4.21E−2 | 3.66E−2 | 4.72E−2 | 3.14E−2 | 2.92E−2 | die), and these molds were provided with a heater for heating and a vacuum evacuator so as to set a vacuum degree inside the mold to be 20 Pa or lower. A load at the time of hot pressing was 300 kN. Further, after charging of the mixture in the mold, an air type oscillator was brought into contact with the mold to enhance orientation of the particles.

By the above-mentioned molding, three kinds of composite materials (XY composite material, YZ composite material and XZ composite material) having orientations of XY, YZ and XZ, respectively of a maximum size of surface of 40 mm×40 mm in terms of X direction, Y direction and Z direction shown in FIG. 4 were obtained.

TABLE 4

| Composition (wt %) | Example | | |
|---|---|---|---|
| | 14 | 15 | 16 |
| Graphene aggregates 1 (expanded graphite) | 20 | 20 | 20 |
| Graphite particles 4 (400 μm) | 80 | 80 | 80 |
| Metal mold (see Table 5 and FIG. 4) | XY type | YZ type | XZ type |
| Hot press time (min) | 5 | 5 | 5 |
| Hot press temperature (° C.) | 90 | 90 | 90 |

TABLE 5

Sizes of metal molds (upper, middle and lower dies) and molded articles unit: mm

| | XY type | YZ type | XZ type |
|---|---|---|---|
| Size of middle die | | | |
| a | 40 (+0.05, −0) | 10 (+0.05, −0) | 40 (+0.05, −0) |
| b | 40 (+0.05, −0) | 40 (+0.05, −0) | 10 (+0.05, −0) |
| c | 100 | 100 | 100 |
| Size of upper and lower dies | | | |
| a1 | 40 (+0, −0.05) | 10 (+0, −0.05) | 40 (+0, −0.05) |
| b1 | 40 (+0, −0.05) | 40 (+0, −0.05) | 10 (+0, −0.05) |
| c1 | 50 | 35 | 35 |
| Size of composite material | | | |
| x | 40 | 10 | 40 |
| y | 40 | 40 | 10 |
| z | 10 | 40 | 40 |
| Direction of orientation of graphite/graphenes in composite material | XY | XY | XY |
| Direction of 40 mm × 40 mm surface (maximum surface) of composite material | XY | YZ | XZ |

<Heat Dissipator (Heat Sink)>

Examples 17 to 19 and Comparative Example 5

The composite material (XY type) of Example 14, the composite material (YZ type) of Example 15 and the composite material (XZ type) of Example 16 were fixed to a sample holder made of graphite with a hot melt adhesive so that a 40 mm×40 mm surface faces upward, and five grooves of 5 mm wide×5 mm deep were made on the 40 mm×40 mm surface using a FINE CUT machine manufactured by Heiwa Technica Co., Ltd. to make a heat sink. In this case, the grooves were made in an X direction in the case of the XY type, in a Y direction in the case of YZ type and in a Z direction in the case of the XZ type. Meanwhile, an aluminum alloy 5052 was subjected to machining into the same shape as the composite materials and was used as a comparative material.

(Heat Dissipation Characteristics of Heat Sink)

Figure 5:
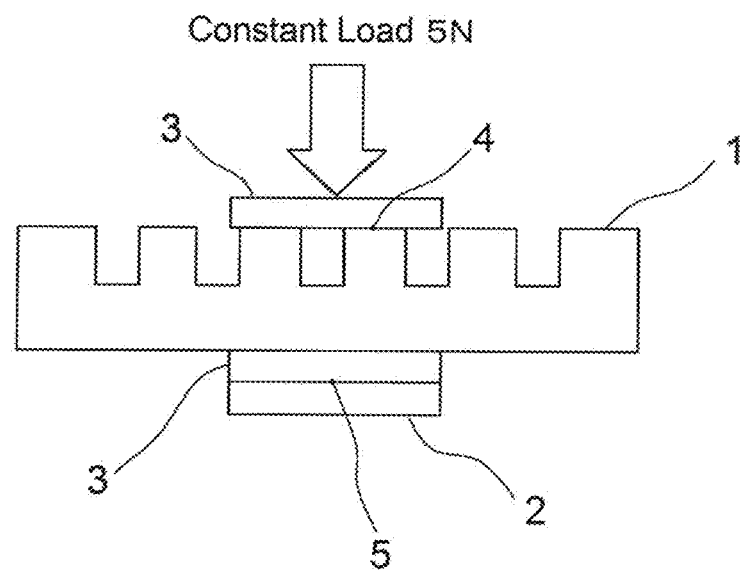
FIG. 5 is a view schematically showing heat dissipation characteristic test of a heat sink of Table 6.

As shown in FIG. 5, the produced heat sink was fixed to a heater with a constant load via a silicone rubber and a thermocouple (2) was set on the heater portion and a thermocouple (1) was set on the top of the heat sink, and then an equilibrium temperature where heat generation and heat dissipation was balanced and a temperature became constant was measured on the heater portion and on the top of the heat sink. The results are shown in Table 6

TABLE 6

| | Example 17 | Example 18 | Example 19 | Com. Ex. 5 |
|---|---|---|---|---|
| Material | Composite material of Example 14 | Composite material of Example 15 | Composite material of Example 16 | Aluminum 5052 |
| Direction of orientation | XY | YZ | XZ | Isotropy |
| Equilibrium temperature (° C.) (Heater portion) | 110 | 76 | 77 | 82 |

TABLE 6-continued

| | Example 17 | Example 18 | Example 19 | Com. Ex. 5 |
|---|---|---|---|---|
| Equilibrium temperature (° C.) (Top of heat sink) | 65 | 73 | 74 | 72 |

As mentioned above, in the heat sink (Example 17) using the same composite material of XY type as in conventional graphite, while thermal conductivity in an in-plane direction is good, thermal conductivity in a thickness direction is not good, and therefore, a temperature on the heater is high and a temperature on the top of the heat sink is lower as compared with a heat sink (Comparative Example 5) using aluminum which had been commonly used as a material for a heat sink. Namely, the result is such that a flow of heat is not good and heat dissipation characteristic is low. On the contrary, in the cases of the heat sink (Example 18) using the composite material of the XZ type of Example 15 and the heat sink (Example 19) using the composite material of YZ type of Example 16, a temperature of the heater is low and a temperature difference from a temperature on the top of the heat sink is small, namely a flow of heat is good and heat dissipation characteristic is high.

Example 20

<Heat Collector>

The composite material of Example 16 was fixed to a sample holder made of graphite with a hot melt adhesive so that a 40 mm×40 mm surface (XZ surface) faces upward, and was cut into a shape of 10 mm wide×40 mm deep×10 mm thick by moving a blade in a Z direction using a FINE CUT machine manufactured by Heiwa Technica Co., Ltd. The cut-out material was fixed to a sample holder made of graphite with a hot melt adhesive so that the XZ surface faces upward similarly.

Figure 6:
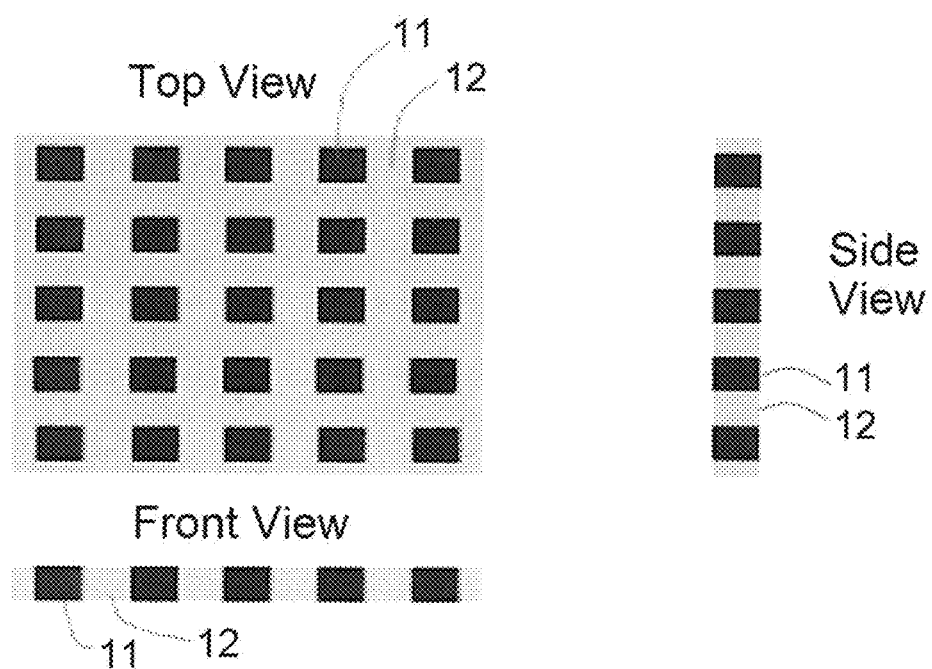
FIG. 6 shows a top view, a front view and a side view of an integrated composite material comprising a columnar graphite/graphene composite material of XZ type and a silicone rubber.
Figure 7:
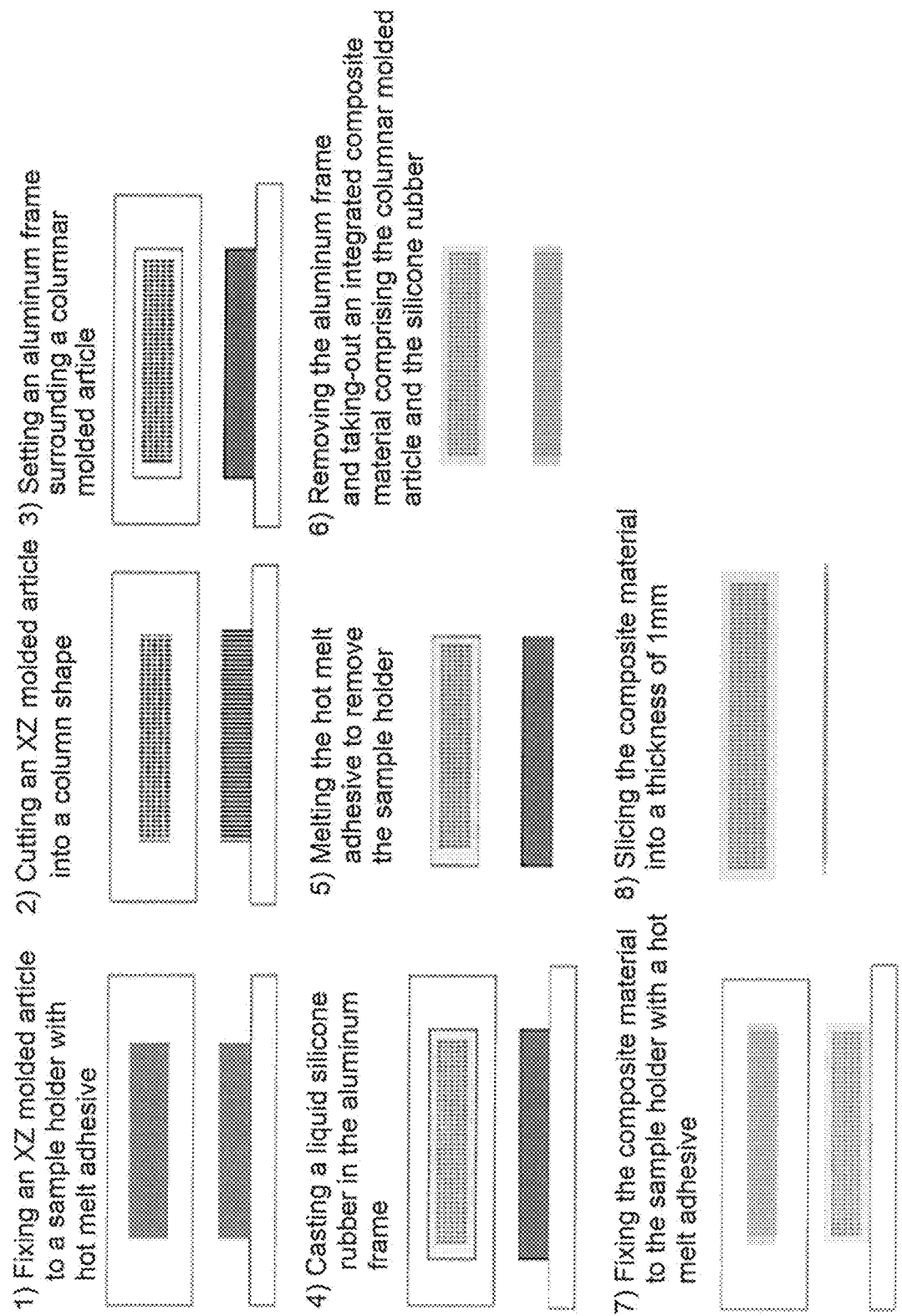
FIG. 7 is a view schematically showing a process for producing the composite material shown in FIG. 6. Samples in respective steps 1) to 8) are shown by top and front views.

The cut-out material was cut in an X direction at a pitch of 100 µm using a metal bonded diamond grind stone having a blade of 100 µm thickness and then cut also in a Y direction at a pitch of 100 µm, thereby processing the composite material into a columnar shape having a square cross section of 100 µm×100 µm and a height of 10 mm. Then, an aluminum frame having inner dimensions of 45 mm×15 mm×10 mm was set so as to surround this columnar composite material, and a liquid silicone rubber produced by Momentive Performance Materials Japan and a curing agent were cast into the frame, followed by curing at 80° C. for 12 hours. After the curing, a molded article was taken out from the aluminum frame and the hot melt adhesive was removed to obtain an integrated composite material comprising the columnar XZ type composite material and the silicone rubber (FIG. 6). FIG. 7 shows a process for manufacturing the composite material.

The obtained composite material was again fixed to a sample holder made of graphite with a hot melt adhesive and was sliced into a shape of 10 mm wide×40 mm deep×1 mm thick by using a FINE CUT machine manufactured by Heiwa Technica Co., Ltd. while keeping the XZ surface facing upward to obtain a heat collector having a structure of a plurality of composite materials being embedded in the silicone rubber.

Heat-Dissipation System

Example 21

As shown in Table 7 and FIG. 8(a), a thermocouple 8 was interposed between a 10 mm×10 mm×2 mm ceramic heater 6 and a heat collector 7 of a silicone rubber, and an amount of heat generation was set to be 5 W with a stabilized power supply device, and a relation of heater temperature to heating time was examined. However, measurement was suspended since the heater temperature reached 136° C. in 28 seconds after starting of heating.

Example 22 and Comparative Example 6

As shown in Table 7 and FIG. 8(b), a 16 mm×150 mm×2 mm heat conductor 9 was further set, a constant load of 1 N was applied to the heater 6 and a heating test was conducted in the same manner as in Example 21 to obtain an equilibrium temperature for making a heater temperature constant. The composite material of Example 14 (Example 22) or copper (Comparative Example 6) was used as a heat conductor (plate).

Example 23

As shown in Table 7 and FIG. 8(c), a 16 mm×40 mm×10 mm heat sink 10 was further set, a constant load of 1 N was applied to the heater and a heating test was conducted in the same manner as in Example 21 to obtain an equilibrium temperature for making a heater temperature constant. The composite material of Example 14 was used as a heat conductor (plate) and the same heat sink as in Example 19 was used.

Example 24

A heating test was conducted in the same manner as in Example 23 to obtain an equilibrium temperature for making a heater temperature constant except that the heat collector of Example 20 was cut into a size of 10 mm×10 mm 1 mm thick which was used as a heat collector (plate) instead of a silicone rubber.

Example 25

A heating test was conducted in the same manner as in Example 23 to obtain an equilibrium temperature for making a heater temperature constant except that the composite material of Example 16 was cut into a size of 10 mm×10 mm 1 mm thick such that an XY surface was in a thickness direction, and was used as a heat collector (plate) instead of a silicone rubber.

TABLE 7

|  | Example | | Com. Ex. | Example | | |
|---|---|---|---|---|---|---|
|  | 21 | 22 | 6 | 23 | 24 | 25 |
| Heat dissipation system | | | | | | |
| Heater 6 (an amount of heat generation) | | | | 5 W | | |
| Heat collector 7 | Silicone rubber | Silicone rubber | Silicone rubber | Silicone rubber | Heat collecting plate of Ex. 20 | Composite material of Ex. 16 |

TABLE 7-continued

|  | Example | Com. Ex. | Example | | |
|---|---|---|---|---|---|
|  | 21 | 22 | 6 | 23 | 24 | 25 |
| Thermocouple 8 | | | JIS T thermocouple | | | |
| Heat conductor 9 | — | Composite material of Ex. 14 | Copper | Composite material of Ex. 14 | Composite material of Ex. 14 | Composite material of Ex. 14 |
| Heat sink 10 | — | — | — | Heat sink of Ex. 19 | Heat sink of Ex. 19 | Heat sink of Ex. 19 |
| Corresponding figure | FIG. 8(a) | FIG. 8(b) | FIG. 8(b) | FIG. 8(c) | FIG. 8(c) | FIG. 8(c) |
| Equilibrium temperature (° C.) | — | 79 | 88 | 65 | 57 | 62 |

Example 26

A black coating solution was prepared by mixing 100 g of a liquid phenolic resin (BRL2854 available from SHOWA DENKO K.K.), 5 g of conductive carbon black (Ketchen black EC300J, Lion Specialty Chemicals Co., Ltd) and 100 g of isopropyl alcohol, followed by mixing at 800 rpm for 15 minutes using a three-one motor stirrer (BLh1200 manufactured by AS ONE Corporation). The coating solution was applied to a molded article of XY type made in the same manner as in Example 14 by a dip coating method to obtain a coating layer-imparted article having a coating thickness of 60 μm. The coating layer-imparted article was, after air drying, subjected to drying and curing treatment at 80° C. for two hours, at 120° C. for one hour and at 180° C. for two hours (coating layer-imparted article A). The coating layer of the coating layer-imparted article A was black.

Example 27

A water-soluble polyester resin (PLAS COAT Z221 available from GOO CHEMICAL CO., LTD.) was applied with a spray gun to a molded article of XY type made in the same manner as in Example 14 to obtain a coating layer-imparted article having a coating thickness of m. The coating layer-imparted article was, after air drying, subjected to drying and curing treatment at 80° C. for one hour and at 120° C. for one hour (coating layer-imparted article B). The coating layer of the coating layer-imparted article A was transparent.
(Insulation Test)
Surface resistances of the coating layer-imparted article A and the coating layer-imparted article B produced in Examples 26 and 27, respectively were measured with a 4-terminal 4-pin constant current applying meter (Loresta UP) manufactured by Mitsubishi Chemical Analytech Co., Ltd. and the both showed surface resistances of $1 \times 10^{10} \Omega/\square$ or more, and it was confirmed that the insulation property was sufficient.
(Drop Test)
The molded article of Example 14, the coating layer-imparted article A of Example 26 and the coating layer-imparted article B of Example 27 were allowed to be dropped from a height of 1 m onto a concrete surface, and the number of drops leading to a breakage of 20% or more decrease in a weight was compared. The number of drops of the molded article of Example 14 was 12 times, the number of drops of the coating layer-imparted article A of Example 26 was 100 times and the number of drops of the coating layer-imparted article B of Example 27 was 14 times, and significant improvement of impact resistance was observed especially in the coating layer-imparted article A.

Example 28

(1) Cutting Out of Composite Material (A)
The molded article of XY type (10 mm in an X direction×40 mm in a Y direction×10 mm in a Z direction) obtained in Example 4 was fixed to a sample holder made of graphite with a hot melt adhesive so that a bottom surface of the molded article would be an XY surface. The fixed composite material was sliced into a shape of 10 mm wide (Z)×40 mm deep (X)×1 mm thick (Y) by using a FINE CUT machine manufactured by Heiwa Technica Co., Ltd. to obtain one composite material (A) having excellent thermal conductivity in the XY direction of the coordinate axes before processing and in the X direction and the Y thickness direction after processing.
(2) Cutting Out of Composite Material (B)
Then, the sample holder made of a graphite was turned by 90°, and the composite material was sliced into a shape of 10 mm wide (Z)×38.5 mm deep (Y)×1 mm thick (X) to obtain 10 sheets of a composite material (B) having excellent thermal conductivity in the XY direction of the coordinate axes before processing and in the Y direction and the X thickness direction after processing.
(3) Cutting Out of Composite Material (C)
Then, the molded article was heated and removed from the sample holder made of a graphite, and after removing the hot melt adhesive with hot water, the molded article was fixed again to the sample holder made of a graphite with the hot melt adhesive so that a YZ surface would be a bottom surface of the molded article. The fixed composite material was sliced into a shape of 20 mm wide (X)×38.5 mm deep (Y)×1 mm thick (Z) by using a FINE CUT machine manufactured by Heiwa Technica Co., Ltd. to obtain two composite materials (C) having excellent thermal conductivity in the XY direction.
(4) Cutting Out of Composite Material (D)
Then, the molded article was heated and removed from the sample holder made of a graphite, and after removing the hot melt adhesive with hot water, the molded article was fixed again to the sample holder made of a graphite with the hot melt adhesive so that a YZ surface would be a bottom surface of the molded article, in a state of the axes Y and Z being rotated by 10° as compared with the above case (3). The fixed composite material was sliced by using a FINE CUT machine manufactured by Heiwa Technica Co., Ltd. to obtain one composite material (D) of 20 mm wide (X)×28 mm deep (Y)×1 mm thick (Z) in a state of the XY surface being inclined by 10° relative to a cutting surface.

(5) Cutting Out of Composite Material (E)

Then, the molded article was heated and removed from the sample holder made of a graphite, and after removing the hot melt adhesive with hot water, the molded article was fixed again to the sample holder made of a graphite with the hot melt adhesive so that a YZ surface would be a bottom surface of the molded article, in a state of the axes Y and Z being rotated by 20° as compared with the above case (3). The fixed composite material was sliced by using a FINE CUT machine manufactured by Heiwa Technica Co., Ltd. to obtain one composite material (D) of 20 mm wide (X)×27 mm deep (Y)×1 mm thick (Z) in a state of the XY surface being inclined by 20° relative to a cutting surface.

(6) Evaluation of Processability

Figure 9:
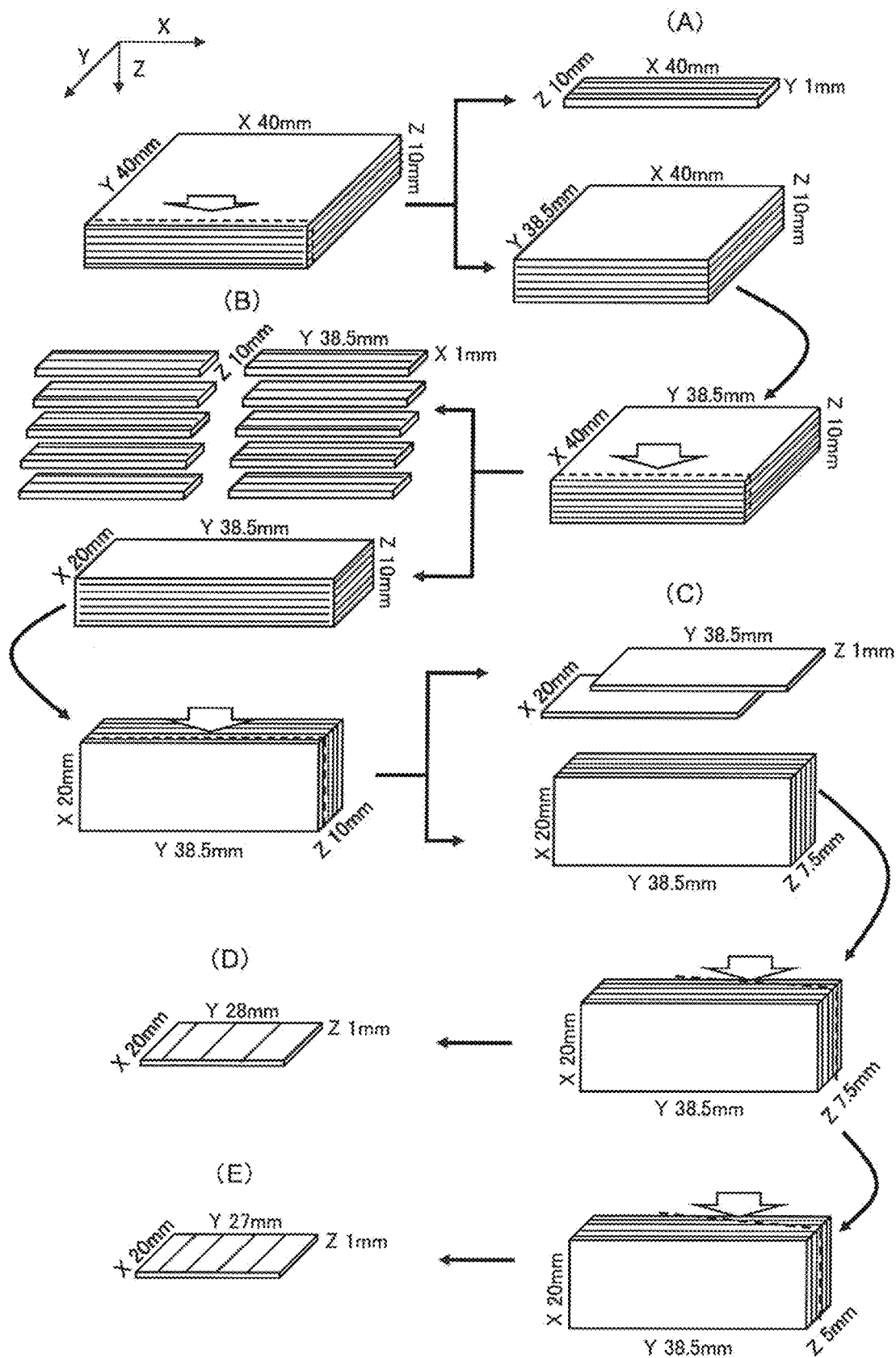
FIG. 9 is a schematic diagram showing processes of Example 28.

In either of slicing process, it was possible at a yield of 100% without breakage of materials, and thin composite materials having different heat conduction directions could be obtained from one molded article. The fabrication method is shown in FIG. 9.

Example 29

(1) Preparation of Molded Article

A molded article of 45 mm in an X direction×45 mm in a Y direction×40 mm in a Z direction was made in the same manner as in Example 14 by using the same mold for an XY type as in Example 14.

(2) Cutting Out of Composite Material on XY Surface

The molded article was fixed to a sample holder made of glass with a hot melt adhesive so that a XZ surface would be a bottom surface of the molded article. Then, the molded article was subjected to simultaneous slicing under processing conditions of a wire width of 1.5 mm, a wire feeding speed of 300 mm/min and a work feeding speed of 20 mm/hr using a multi-wire saw (YASUNAGA UD150 type) and a fixed diamond grain wire having a wire diameter of 150 µm to obtain 20 sliced articles of an XY type of 45 mm in an X direction×45 mm in a Y direction×1.5 mm in a Z direction. After melting of the hot melt adhesive and washing with hot water, an appearance test was conducted. As a result, there was no cracking and yield was 100%. Since a processing time was 120 minutes, a processing time of one sheet was 6 minutes obtained by dividing 120 minutes by 20. The sliced composite material has a directional property of heat conduction such that in-plane (XY) heat conductivity is high and heat conductivity in a thickness direction (Z) is low. Here, XYZ coordinate axes are assumed to be the same as directions at the time of molding.

(3) Cutting Out of Composite Material on XZ Surface

The molded article of an XY type made in the above (1) was fixed to a sample holder made of glass with a hot melt adhesive so that an XY surface would be a bottom surface of the molded article. Then, the molded article was subjected to simultaneous slicing under processing conditions of a wire width of 1.5 mm, a wire feeding speed of 300 mm/min and a work feeding speed of 20 mm/hr using a multi-wire saw (YASUNAGA UD150 type) and a fixed diamond grain wire having a wire diameter of 150 pan to obtain 25 sliced articles of an in-plane XZ type of 45 mm in an X direction× 1.5 mm in a Y direction×40 mm in a Z direction. After melting of the hot melt adhesive and washing with hot water, an appearance test was conducted. As a result, there was no cracking and yield was 100%. Since a processing time was 135 minutes, a processing time of one sheet was 5.4 minutes obtained by dividing 135 minutes by 25. The sliced composite material has a directional property of heat conduction such that heat conductivity of in-plane X direction and thickness direction (Y) is high and heat conductivity in a thickness direction Z is low. Here, XYZ coordinate axes are assumed to be the same as directions at the time of molding.

(4) Cutting Out of Composite Material on YZ Surface

The molded article of an XY type made in the above (1) was fixed to a sample holder made of glass with a hot melt adhesive so that an XY surface would be a bottom surface of the molded article, in a state of the axes X and Y being rotated by 90° as compared with the above case (2). Then, the molded article was subjected to simultaneous slicing under processing conditions of a wire width of 1.5 mm, a wire feeding speed of 300 mm/min and a work feeding speed of 20 mm/hr using a multi-wire saw (YASUNAGA UD150 type) and a fixed diamond grain wire having a wire diameter of 150 µm to obtain 25 sliced articles of an in-plane YZ type of 1.5 mm in an X direction×45 mm in a Y direction×40 mm in a Z direction. After melting of the hot melt adhesive and washing with hot water, an appearance test was conducted. As a result, there was no cracking and yield was 100%. Since a processing time was 135 minutes, a processing time of one sheet was 5.4 minutes obtained by dividing 135 minutes by 25. The sliced composite material has a directional property of heat conduction such that heat conductivity of in-plane Y direction and a thickness direction (X) is high and heat conductivity in a thickness direction Z is low. Here, XYZ coordinate axes are assumed to be the same as directions at the time of molding.

Example 30

(1) Preparation of Molded Article

A molded article of 40 mm in an X direction×40 mm in a Y direction×10 mm in a Z direction was made in the same manner as in Example 14 except that an amount of graphene aggregates 1, an amount of graphite particles, a degree of vacuum in a mold and a load at hot pressing were set to be 2% by weight, 98% by weight, 10 Pa or less and 200 kN, respectively.

(2) Cutting Out of Composite Material

The molded article obtained above was subjected to multi-slicing in the same manner as in Example 29 (2) to make a thin composite material of 40 mm in an X direction× 40 mm in a Y direction×0.5 mm in a Z direction having excellent thermal conductivity in a direction of an XY surface.

(3) Preparation of Aluminum Composite Plate (1)

An aluminum alloy (A1050) thin plate having a heat conductivity of 230 W/(m·K) and a shape of 40 mm×40 mm×0.2 mm was adhered to one surface of the composite material cut-out above (2) using a thermal conductive adhesive to produce an aluminum composite plate (1) having a total thickness of 0.73 mm.

(4) Preparation of Aluminum Composite Plate (2)

Aluminum alloy (A1050) thin plates having a heat conductivity of 230 W/(m·K) and a shape of 40 mm×40 mm×0.2 mm were adhered to both surfaces of the composite material cut-out above (2) using a thermal conductive adhesive to produce an aluminum composite plate (2) having a total thickness of 0.76 mm.

(5) Evaluation

For the composite material, the aluminum composite plate (1), the aluminum composite plate (2) and the aluminum alloy as Comparative Example which were produced above, a bending strength and heat dissipation characteristic were measured by the methods mentioned below. The results are shown in Table 8.

(Bending Strength)

A maximum load was measured with a digital force gauge ZTA-2500N by gradually applying a load to a sample using a measuring stand MX2-2500N fitted with a bending jig GAS000N and manufactured by Imada Co., Ltd. A maximum stress (MPa) corresponding to the bending strength was calculated from the measured maximum load and outer dimensions and a thickness of the sample.

(Heat Dissipation Characteristic)

Figure 10:
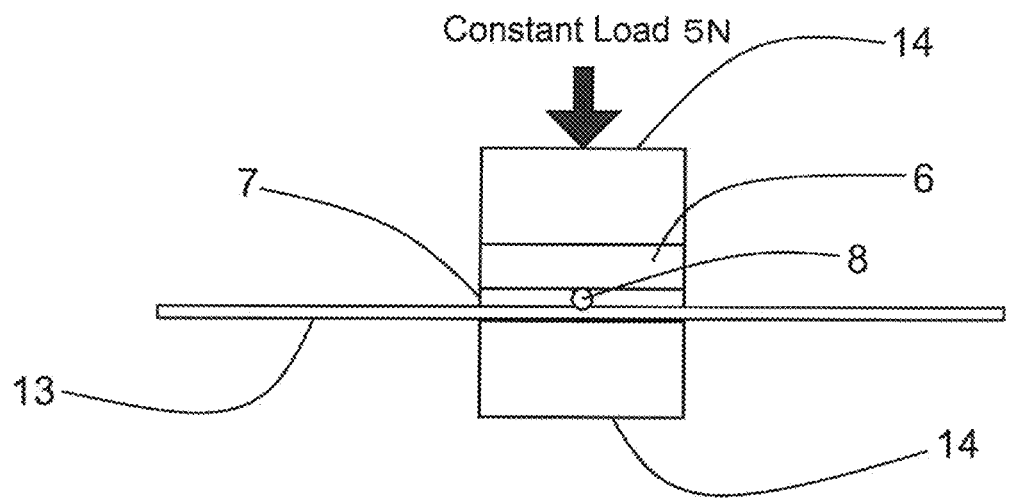
FIG. 10 is a schematic diagram showing a test of Example 30.

Heat dissipation characteristic was compared by a test method shown in FIG. 10 by sandwiching a thermocouple 8 between a ceramic heater 6 of 10 mm×10 mm×2 mm and a heat collecting plate 7 of a silicone rubber and further combining a sample 13 and a heat insulating member 14. Incidentally, while the load was fixed at 5N, an amount of heat generation was varied to 4W, 8W, and 15W, respectively by a stabilized power supply device. In each case, a temperature when the temperature indicated by the thermocouple became constant was measured, and was used as a heater equilibrium temperature for comparison.

sity: 0.028 g/cm$^3$ into a metal mold for an XY type having a height of 200 mm in the Z-direction while maintaining a degree of vacuum of less than 20 Pa inside the mold. The bulk density was adjusted by controlling a push-in quantity of the mold, i.e., a thickness of the molded article, according to an input of the expanded graphite since the acreage is the same. Further a porosity is a value calculated from a difference between a theoretical density (true density 2.26 g/cm$^3$) and a bulk density of graphite by (theoretical density−bulk density)/theoretical density.

Dimensions and bulk densities of the molded articles are shown in Table 9.

TABLE 9

| | Dimensions | | | Weight (g) | Bulk density (g/cm$^3$) | Porosity (%) |
|---|---|---|---|---|---|---|
| | X (mm) | Y (mm) | Z (mm) | | | |
| Molded article 1 | 45 | 45 | 20 | 12.2 | 0.3 | 86.7 |
| Molded article 2 | 45 | 45 | 20 | 20.3 | 0.5 | 77.8 |
| Molded article 3 | 45 | 45 | 15 | 21.3 | 0.7 | 69.0 |

TABLE 8

| | Configuration | | | | Bending strength (MPa) | Equilibrium temperature (° C.) of Heater | | |
|---|---|---|---|---|---|---|---|---|
| | Center portion | Front surface | Back surface | Total thickness | | 4 w | 8 w | 15 w |
| Composite material | Composite material 0.5 mm | Nil | Nil | 0.5 mm | 9 | 58.2 | 86.9 | 128.7 |
| Aluminum composite plate (1) | Composite material 0.5 mm | Aluminum 0.2 mm | Nil | 0.7 mm | 91 | 55.2 | 80.8 | 124.2 |
| Aluminum composite plate (2) | Composite material 0.5 mm | Aluminum 0.1 mm | Aluminum 0.1 mm | 0.7 mm | 95 | 54.6 | 80.5 | 120.9 |
| Aluminum alloy | Aluminum 0.5 mm | Nil | Nil | 0.5 mm | 200 | 61.7 | 95.1 | 147.6 |

As shown in Table 8, the composite material, the aluminum composite plate (1) and the aluminum composite plate (2) made above exhibited excellent heat dissipation characteristics to the aluminum alloy of Comparative Example. Further, while the aluminum composite plate (1) reinforced with an aluminum sheet on its front surface and the aluminum composite plate (2) reinforced with aluminum sheets on its front and back surfaces are thicker by 2 mm, as compared to the composite material having no aluminum sheet, heat dissipation characteristics thereof are excellent, and a bending strength is also greatly improved.

Example 31

(1) Preparation of Expanded Graphite

The expanded graphite (tap density: 0.028 g/cm$^3$) produced during preparation of the graphene aggregates (1) was used.

(2) Preparation of Composite Material

Six kinds of molded articles (molded articles 1 to 6) having a shape of 45 mm in an X direction×45 mm in a Y direction×20 mm in a Z direction and bulk densities of 0.3 g/cm$^3$, 0.5 g/cm$^3$, 0.7 g/cm$^3$, 0.9 g/cm$^3$, 1.2 g/cm$^3$, 1.4 g/cm$^a$ were prepared in the same manner as in Example 14 by directly charging the expanded graphite having a tap den- TABLE 9-continued

| | Dimensions | | | Weight (g) | Bulk density (g/cm$^3$) | Porosity (%) |
|---|---|---|---|---|---|---|
| | X (mm) | Y (mm) | Z (mm) | | | |
| Molded article 4 | 45 | 45 | 15 | 27.3 | 0.9 | 60.2 |
| Molded article 5 | 45 | 45 | 10 | 24.3 | 1.2 | 46.9 |
| Molded article 6 | 45 | 45 | 10 | 28.4 | 1.4 | 37.9 |

(3) Preparation of Silicone Rubber Composite Material

An aluminum frame having inner dimensions of 46 mm×46 mm was mounted on each of the six molded articles so as to surround the respective molded articles, and after maintaining a degree of vacuum of 2 Pa in a glove box capable of being evacuated, a liquid silicone rubber available from Momentive Materials Performance Japan and a curing agent were cast into the aluminum frame, and were held for one hour. Then, the cast samples were taken out from the glove box and were cured at 80° C. for 12 hours using a dryer. After the curing, the molded articles were taken out from the aluminum frame to obtain integrated composite materials 1 to 6 comprising the respective molded articles with each bulk density and the silicone rubber.

(4) Cutting Out of Composite Materials

After fixing the obtained six kinds of composite materials to the sample holder made of a graphite with a hot melt adhesive so that an XY surface would be a bottom surface of the composite material, the composite material was sliced into a shape of 10 mm wide (X)×45 mm deep (Y)×10 mm thick (Z) by using a FINE CUT machine manufactured by Heiwa Technica Co., Ltd. Then, the molded article was heated and removed from the sample holder made of graphite, and after removing the hot melt adhesive with hot water, the molded article was again sliced into a shape of 10 mm wide (X)×10 mm deep (Z)×1 mm thick (Y) so that an XY surface would be a bottom surface to obtain composite materials 1 to 6 having a thickness of 1 mm.

(5) Evaluation

For the composite materials 1 to 6, compressibility and heat resistance were measured by the methods mentioned below. The results are shown in Table 10.

(Measurement of Compressibility)

After cutting out each of the composite materials into a shape of 10 mm×10 mm×1 mm, compressibility was measured by applying a load of 7 N to the composite material using a measuring stand MX2-2500N manufactured by Imada Co., Ltd. The compressibility was calculated by (displacement/thickness of a sample with no load)×100(%). Compressibility of the heat collector of Example 20 was also measured similarly and was compared.

(Heat resistance)

Figure 11:
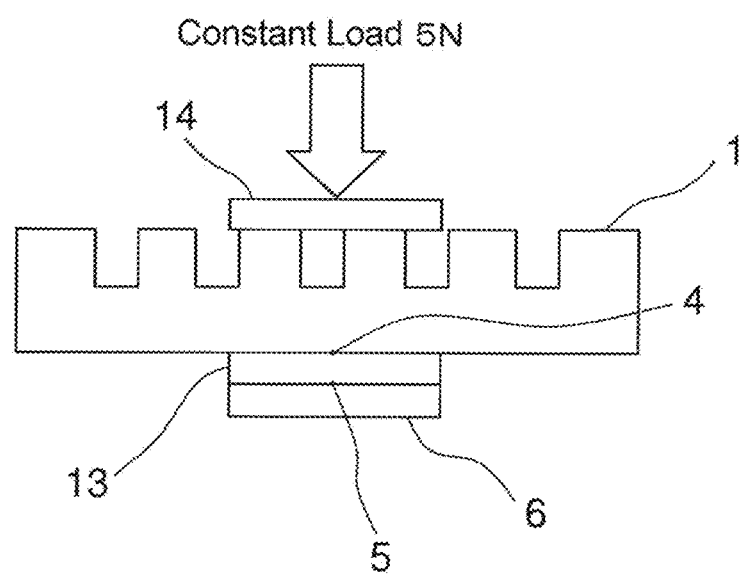
FIG. 11 is a schematic diagram showing a test of Example 31.

After having been cut out into a shape of 10 mm×10 mm×1 mm, each of the cutout composite materials was mounted as a heat collector plate between the aluminum heat sink of Comparative Example 5 and the ceramic heater 6 of 10 mm×10 mm×2 mm used in Example 21 as shown in FIG. 11. A quantity of electricity 5W was applied to the heater, and a temperature difference between the front surface and the back surface of the heat collecting plate was measured with thermocouples placed at the top and bottom of the heat collecting plate while applying a load of 5N. A heat resistance was calculated from the measured temperature difference by an equation Heat resistance (° C./W)=(Temperature difference ° C. between the front surface and the back surface of the heat collecting plate)/Applied quantity of electricity (W).

A heat resistance of the heat collector of Example 20 was also measured similarly and was compared.

thereof, thereby functioning to efficiently transfer heat. Therefore, flexibility of the heat collector is also important performance. In the case of the same load, larger compressibility leads to high flexibility and enables larger irregularities to be filled, which indicates that characteristic as a heat collector is good. There is a case where a heat collecting plate having as low heat resistance as possible is required even if compressibility thereof is small or a heat collecting plate having large compressibility is required even if heat resistance thereof is somewhat high. Thus, an appropriate heat collecting plate is required to be used, depending on kind and application of a heat-dissipation system. The heat collecting plate of Example 20 is characterized by having small compressibility while having a remarkably low heat resistance. Meanwhile, the heat collecting plate of Example 31 is characterized by having remarkably excellent compressibility while having a higher heat resistance as compared with that of Example 20.

EXPLANATION OF SYMBOLS

1 Heat sink
2 Heater
3 Silicone rubber
4 Thermocouple (1)
5 Thermocouple (2)
6 Heater
7 Heat collector
8 Thermocouple
9 Heat conductor
10 Heat sink
11 Graphite/graphene composite material (XZ type)
12 Silicone rubber
13 Sample
14 Heat insulating material

The invention claimed is:

1. A graphite/graphene composite material consisting essentially of flat graphite particles and graphene aggregates,
   wherein the flat graphite particles are stacked using the graphene aggregates as a binder so that basal surfaces of the graphite particles are overlapped with one another, and
   the graphene aggregates are composed of deposited single-layer or multi-layer graphenes.

TABLE 10

| | Dimensions of heat collector | | | Compressibility | Heat resistance |
|---|---|---|---|---|---|
| | X (mm) | Y (mm) | Z (mm) | (%) | (° C./W) |
| Composite material 1 | 10 | 1 | 10 | 22.8 | 5.20 |
| Composite material 2 | 10 | 1 | 10 | 21.5 | 2.52 |
| Composite material 3 | 10 | 1 | 10 | 20.2 | 1.08 |
| Composite material 4 | 10 | 1 | 10 | 18.9 | 0.65 |
| Composite material 5 | 10 | 1 | 10 | 14.5 | 0.43 |
| Composite materiat 6 | 10 | 1 | 10 | 11.3 | 0.36 |
| Example 20 | 10 | 1 | 10 | 4.5 | 0.08 |

The results indicate that the smaller the heat resistance is, the lower the resistance to the heat flow is and the more excellent the performance of the heat collector is. On the other hand, the heat collector is mounted between a heat source and a heat dissipator and is required to fill the spaces formed by irregularities and small warpage on the surfaces 2. The graphite/graphene composite material of claim 1, wherein an average particle size of the flat graphite particles is 10 to 1000 μm, and a thickness thereof is 1 to 50 μm.

3. The graphite/graphene composite material of claim 1, wherein an average diameter of the graphene aggregates is 1 to 1000 μm, and a thickness thereof is less than 50 μm.

4. The graphite/graphene composite material of claim 1, wherein a mass ratio of the flat graphite particles to a total mass of the flat graphite particles and the graphene aggregates is 1 to 99 mass %.

5. The graphite/graphene composite material of claim 1, wherein a half value width (2θ) of a 004 diffraction line in X-ray diffraction is less than 0.3°.

6. The graphite/graphene composite material of claim 1, having a bulk density of 1.9 g/cm³ or more.

7. The graphite/graphene composite material of claim 1, having a thickness of 100 μm or more in a direction of stacking of the flat graphite particles.

8. The graphite/graphene composite material of claim 1, having a coating layer on a whole or a part of an outer surface of the graphite/graphene composite material.

9. A heat collector comprising the graphite/graphene composite material of claim 1.

10. A heat collector comprising the graphite/graphene composite material of claim 7, and having a structure such that a plurality of the graphite/graphene composite materials in a shape of column is embedded in a flexible material.

11. A heat conductor comprising the graphite/graphene composite material of claim 1.

12. A heat dissipator comprising the graphite/graphene composite material of claim 1.

13. The heat dissipator of claim 12, wherein the graphite/graphene composite material is combined with a metal for compensation of relatively lower thermal conductivity of the flat graphite particles in a stacking direction of graphite than in other directions.

14. A heat dissipation system comprising a heat collector absorbing heat from a heating element, a heat conductor transmitting heat from the heat collector to a heat dissipator, and a heat dissipator releasing the heat received from the heat conductor, wherein at least one of the heat collector, the heat conductor and the heat dissipator comprises the graphite/graphene composite material of claim 1.

15. A heat collector comprising the graphite/graphene composite material of claim 7, and having a structure such that the graphite/graphene composite materials is embedded in a flexible material.

16. A method of producing the graphite/graphene composite material of claim 1, the method comprising:
(1) a step of mixing graphite particles in a flat shape with graphene aggregates to obtain a mixture,
(2) a step of filling the mixture in a metal mold and stacking the flat graphite particles using the graphene aggregates as a binder so that basal surfaces of the graphite particles are overlapped with one another to obtain a stack, and
(3) a step of subjecting the stack to cutting out so that a cross section of the flat graphite particles in a stacking direction thereof appears or subjecting the slack to cutting out along layer of the flat graphite particles.

17. The method of claim 16, wherein a thickness in the stacking direction of the stack obtained by the step (2) is 100 μm or more.

18. The method of claim 16, wherein a thickness of cutting out in the step (3) is 0.1 mm or more.

19. The method of claim 16 further comprising a step for preparing the graphene aggregates to be provided for the step (1), the step for preparing the graphene aggregates being a step of separating a solvent from a graphene dispersion of a single-layer or multi-layer graphenes in the solvent.

20. The method of claim 19, wherein the solvent comprises a lower alcohol or water.

* * * * *